(12) United States Patent
Inenaga et al.

(10) Patent No.: US 7,154,113 B2
(45) Date of Patent: Dec. 26, 2006

(54) TECHNIQUES FOR WAFER PREALIGNMENT AND SENSING EDGE POSITION

(75) Inventors: Masamichi Inenaga, Fukuoka (JP); Yuji Arinaga, Fukuoka (JP); Shinichi Katsuda, Fukuoka (JP); Takayuki Imanaka, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 11/259,130

(22) Filed: Oct. 27, 2005

(65) Prior Publication Data

US 2006/0038142 A1    Feb. 23, 2006

Related U.S. Application Data

(62) Division of application No. 10/415,733, filed as application No. PCT/JP01/09609 on Nov. 1, 2001.

(30) Foreign Application Priority Data

| Nov. 2, 2000 | (JP) | ............... P. 2000-335530 |
| Nov. 7, 2000 | (JP) | ............... P. 2000-338601 |
| Nov. 20, 2000 | (JP) | ............... P. 2000-352309 |

(51) Int. Cl.
    *G01N 21/86*    (2006.01)
(52) U.S. Cl. ............... 250/559.36; 250/559.29
(58) Field of Classification Search ........... 250/559.29, 250/559.3, 559.36; 356/237.4, 237.5
See application file for complete search history.

(56) References Cited

U.S. PATENT DOCUMENTS

| 4,559,452 | A | | 12/1985 | Igaki et al. |
| 5,353,070 | A | * | 10/1994 | Mitani et al. ............... 348/781 |
| 5,357,164 | A | * | 10/1994 | Imabayashi et al. ... 310/323.15 |
| 6,118,165 | A | * | 9/2000 | Yano ........................ 257/436 |

FOREIGN PATENT DOCUMENTS

| JP | 59-604 A | 1/1984 |
| JP | 63-70436 A | 3/1988 |
| JP | 3-136264 A | 6/1991 |
| JP | 6-255707 A | 9/1994 |
| JP | 07-176524 A1 | 7/1995 |

* cited by examiner

Primary Examiner—Thanh X. Luu
(74) Attorney, Agent, or Firm—Sughrue Mion, PLLC

(57) ABSTRACT

A prealignment sensor comprising a frame fixed to a base and having a U-shape when viewed from its side. A light source is attached to a lower part of the flame. A convex lens is attached to a lower part of an inside of the frame by which diffused light of the light source is transformed into parallel light. A lens holder is provided for fixing the convex lens to the frame. An optical receiver is attached to an upper part of an inside of the frame by which the parallel light is received and is transformed into an electrical signal. A signal processing circuit is attached to the frame by which the electric signal is transformed into a desired displacement magnitude. The frame is formed of aluminum subjected to sulfuric-acid hard alumite treatment and then to steam sealing.

8 Claims, 17 Drawing Sheets

TECHNIQUES FOR WAFER PREALIGNMENT AND SENSING EDGE POSITION

This is a divisional of application Ser. No. 10/415,733 filed Oct. 14, 2003. The entire disclosure of the prior application, application Ser. No. 10/415,733 is hereby incorporated by reference.

TECHNICAL FIELD

This invention relates to a prealignment apparatus used in semiconductor-fabrication equipment for sensing or prealigning the position of a substantially circular semiconductor wafer or the position of an orientation flat or a notch, and a prealignment method and prealignment apparatus for a substantially circular wafer having a V-shaped cut called a notch or a cut called an orientation flat. Particularly, this invention relates to a method for sensing a wafer-edge position by use of a CCD linear sensor and relates to a prealignment sensor used in semiconductor-fabrication equipment for sensing the position of a semiconductor wafer, an orientation flat, or a notch.

BACKGROUND ART

A conventional prealignment sensor apparatus will be described with reference to FIG. 12. In FIG. 12, a table 4 is rotatably attached to the top of a shaft of the upper part of a motor 2, and can block a space between a light source 7 disposed at the lower part of its outer periphery and a CCD linear sensor 5 serving as a light receiving section disposed at the upper part of the apparatus when a wafer 1 is placed on the table 4. Reference numeral 26 designates a prealignment sensor, and is made up of the light source 7, a lens 8, the CCD linear sensor 5, a CCD linear sensor mounting board 6, and a frame 35 having a U-shape and holding them. Light of the light source 7 is changed into parallel rays of light by the lens 8, and is received by the CCD linear sensor 5. Reference numeral 10 designates a sensor controller, and is made up of a CCD linear sensor drive section 11, a wafer edge sensing section 12, a light emission drive section 13, a memory 14, a CPU 15, and a data communicating section 16. A system controller 17 is made up of a memory 18, a CPU 19, a data communicating section 20, an encoder signal processing section 21, a motor commander 22, a wafer presence sensor signal section 23, and a wafer transfer control section 24. The light emission drive section 13 feeds an electric current to the light source 7 so that light is emitted therefrom. The CCD linear sensor drive section 11 transmits a read-out-gate pulse signal (ROG signal), which is a timing signal used when the stored electric charge of pixels is transformed into an electrical signal, and a transfer pulse signal to the CCD linear sensor 5 consisting of a great many pixels that are linearly arranged and each of which has a fixed order, the stored electric charge is then read out in order from the first pixel that occupies a scan start point in accordance with the transfer pulse signal, the stored electric charge of all pixels is then sequentially output as a sense signal, and the wafer edge sensing section 12 receives the sense signal and other signals so as to sense the position. Information regarding the sensed position is output outward through the data communicating section 16, and the motor commander 22 of the system controller 17 outputs a rotation command signal to the motor 2, whereby the motor 2 is rotated. The wafer presence sensor 25, which is an optical, or a contact-type, or a capacitive sensor, is provided separately from the prealignment sensor 26, and can sense whether a wafer is present or absent in front thereof by allowing the wafer presence sensor signal processing section 23 to operate the wafer presence sensor 25. The encoder signal processing section 21 obtains the rotation signal of the encoder 3 connected to the motor 2 and senses the revolving speed of the motor 2.

A supplementary explanation will now be given of the CCD linear sensor 5. It is necessary to store an electric charge for the most suitable fixed time in the CCD linear sensor 5, in order to project a bright and dark image onto the CCD linear sensor 5 and generate a wafer edge signal. As a method for storing the electric charge for the most suitable fixed time, there are known, for example:

(1) a method for controlling the ON/OFF of light emission by the light emission drive section 13 synchronously with a measurement command and controlling the illuminating light 9 and the ROG signal so that a fixed amount of electric charge is stored in the CCD linear sensor 5 at each measurement, (2) a method in which the CCD linear sensor mounting board 6 is provided with an electronic shutter function of the CCD linear sensor, and the illuminating light 9 is emitted constantly in quantity while light is always being emitted by the light emission drive section 13, thus controlling the storage time of the electric charge stored in the CCD linear sensor 5 independently of the ROG signal, and (3) a method for keeping an electric charge stored in the CCD linear sensor 5 constant by allowing the CCD linear sensor drive section 11 to output an ROG signal and a transfer pulse signal at regular periodic intervals.

Method (1) has a problem in the fact that the repeated measurement cycles become slower, or the processing of the sensor controller 10 becomes complex, and method (2) has a problem in the fact that, since there is a need to provide the electronic shutter function of the CCD linear sensor, wires and costs increase, or the processing of the sensor controller 10 becomes complex. Therefore, conventionally, attention has been paid to improving the speed of prealignment time, facilitating the processing, and reducing the cost of the apparatus, and, as a result, method (3) has been widely employed.

With the aforementioned structure, the system controller 17 and the sensor controller 10 operate as follows. After a wafer conveying system, not shown, conveys a wafer to the table 4 when no wafer is placed on the table 4, the system controller 17 rotates the table 4 and allows the encoder signal processing section 21 to measure a signal of the encoder 3. When a predetermined rotational position is obtained, a measurement command is output to the sensor controller 10 through the data communicating section 20 to start measurement.

When the sensor controller 10 receives the output of the measurement command, the wafer edge sensing section 12 receives a wafer edge signal output by the CCD linear sensor 5, and a wafer edge sensed value is output to the system controller 17 through the data communicating section 16. The system controller 17 stores the received wafer edge sensed value and the measurement rotational position in the memory 18, and records outer-circumference data corresponding to one round of the wafer in the memory 18 by repeating the same operation until the wafer 1 makes one or more rotations. The center position, orientation flat, or notch position of the wafer 1 is calculated by the CPU 19 on the basis of the outer-circumference data corresponding to one round of the wafer recorded in the memory 18.

As a second conventional technique, a method for performing accurate positioning not by parallel rays of light but by a point light source is disclosed in Japanese Unexamined Patent Publication No. Hei-8-64660, and this conventional technique will be described with reference to a block diagram of a wafer position sensing apparatus of FIG. 13. A table 4 can rotate by a motor 2. A light source 7 is disposed at the lower part, and a CCD linear sensor 5 serving as a light receiving section is disposed at the upper part, with the wafer 1 placed on the table 4 therebetween. Light projected from the light source 7 to the outer circumference of the wafer 1 is shielded by the wafer 1, and a bright and dark image is projected onto the CCD linear sensor 5. This image is binarized by a signal-processing section 34b of a sensor controller 10c. A data value obtained at a moment when a change occurs from darkness to brightness is extracted from the binarized data, is then held by a latch, and is recorded in a memory 32b of a system controller 17c. This operation is repeated until the wafer 1 makes one rotation, and outer-circumference data corresponding to one round of the wafer 1 is recorded in the memory 32b. Simultaneously, a signal of the encoder 3 connected directly to the motor 2 by which the table 4 is rotated is input to the system controller 17c, and data regarding the motor rotational position and data regarding the wafer edge position are simultaneously recorded in the memory 32b. An arithmetic section 33b calculates the center position, orientation flat, and notch position of the wafer 1 on the basis of the outer-circumference data corresponding to one round of the wafer 1 recorded in the memory 32.

In semiconductor-fabrication equipment, a prealignment sensor for a wafer is conventionally used for the positioning of the center, orientation flat, and notch of the wafer. Therefore, a conventional wafer positioning method will be described with reference to a block diagram of an apparatus for sensing the edge position of a wafer outer circumference that uses the CCD linear sensor of FIG. 17. A substantially circular opaque wafer 142 is placed on a stage 141, and a light source 143 and a CCD linear sensor 144 are disposed with the outer circumference of the wafer 142 therebetween. When the outer circumference of the wafer 142 is illuminated with light emitted from the light source 143, the light is shielded by the wafer 142, and a bright and dark image is projected onto the CCD linear sensor 144. This image is used as an edge signal binarized by a signal-processing section 145 of a signal processing board 1411. A data value obtained at a moment when the edge signal is changed from brightness to darkness is held by a latch circuit disposed in the interior thereof, and is output and recorded in a memory 147 of a calculator 1410. The same operation is repeated until the wafer 142 makes one rotation by the stage 141, and outer-circumference data corresponding to one round of the wafer is recorded in the memory 147. The signal-processing section 145 and the memory 147 are operated according to a command of the CPU 149 of the calculator 1410 in coordination thereof. Based on the outer-circumference data of the memory 147, a data processing section 148 calculates the orientation flat position or notch position of the wafer 142 and the center position of the wafer 141. When this operation is performed, a scan starts from an end of the CCD linear sensor 144 in the signal-processing section 145. When a rise change point of the edge signal is sensed, edge position data obtained at this time is latched and stored in the memory 147. Normally, the edge signal reaches a state like an edge signal 1413 of FIG. 15, and a bright and dark change point of the image projected onto the CCD linear sensor 144 is regarded as a rise change point. The one scanning is repeatedly performed while the stage is making one rotation, and the center position, orientation flat, and notch position of the wafer 142 are calculated from data corresponding to one round thereof.

Next, a conventional prealignment sensor will be described with reference to FIG. 18 and FIG. 20. In FIG. 18, reference numeral 181 designates a frame whose side has a U-shape and has been fixed to a base, not shown. Reference numeral 182 designates a light source, which is an LED or a laser, fixed to the lower part of the frame 181. Reference numeral 183 designates a convex lens disposed at the lower part of the inside of the U-shaped frame 181 and by which diffused light is changed into parallel light. Reference numeral 184 designates a lens holder made of resin or aluminum and by which the convex lens 183 is fixed to the frame 181. Reference numeral 185 designates an optical receiver, such as a CCD linear sensor, disposed at the upper part of the inside of the U-shaped frame 181 and which has a sensing portion extending in a sensing direction in the Figure. Reference numeral 186 designates a signal processing circuit disposed at the upper part of the frame 181 and used to obtain the displacement magnitude of an object by processing an electrical signal output from the optical receiver 185. The light source 182, the convex lens 183, and the optical receiver 185 are disposed such that the respective center lines are aligned. The prealignment sensor consists of the frame 181, the light source 182, the lens 183, the lens holder 184, the optical receiver 185, and the signal processing circuit 186. Reference numeral 187 designates a table disposed in the vicinity of the frame 181 and used to rotate a disk-like wafer 188 while placing it thereon. In FIG. 18, when the wafer 188 is placed on the table 187, the left end of the wafer 188 blocks a space between the convex lens 183 and the optical receiver 185.

With the aforementioned structure, the operation performed when the prealignment sensor senses the center position, orientation flat, or notch position of the wafer will be described as follows. Diffused light emitted from the light source 182 is first changed into parallel rays of light by the convex lens 183, and then projected onto the optical receiver 185. If the wafer 188 does not exist on the table 187 when projected, the parallel light is projected onto the whole surface of the sensing portion of the optical receiver 185. The wafer 188 is then placed on the table 187 so as to block the parallel light, and, as a result, a bright and dark image having a part resulting from blocking the light and a part resulting from transmitting the light is generated on the optical receiver 185. The bright and dark range thereof is sensed by the optical receiver 5, and is transformed into an electrical signal, thus making it possible to sense the edge position of the wafer 188. Further, if the edge position of the wafer 188 is sensed at a predetermined position while the table 187 is making one rotation in a θ direction, the center position of the wafer 188 can be calculated from the relationship between the rotational amount of the table 187 and the displacement.

Generally, aluminum subjected to alumite treatment for a metallic part and polyacetal resin for a resinous part are used as members constituting the prealignment sensor.

However, a conventional problem resides in that as the size of the apparatus increases, the cost thereof increases, and the number of wires increases when a wafer presence sensor is provided besides the prealignment sensor.

Another problem is as follows. If a method is employed for sensing a wafer edge by outputting a measurement command to the sensor controller 10 when the table 4 is rotated so that a rotational position obtained by processing the signal of the encoder 3 in the encoder signal processing section 21 becomes equal to a measurement position under the condition that the driving cycle of the CCD linear sensor is fixed, a measured wafer edge sensed value becomes a measurement value including irregular errors different from an original measurement position because of the asynchronous relationship between the measurement command and the driving cycle of the CCD linear sensor, and therefore, disadvantageously, difficulties arise in improving the speed of prealignment and in improving the accuracy thereof, thus exerting an influence on increasing the diameter of the wafer and on improving the throughput thereof.

Still another problem is as follows. It is known in the conventional technique that, since a wafer made of an opaque material like silicon is unsusceptible to dirt having the possibility of adhering to the CCD linear sensor, the CCD linear sensor should be scanned from a direction in which the wafer is inserted, and, in contrast, when a wafer made of a transparent material like glass is employed, only the edge part thereof blocks light, and therefore the CCD linear sensor should be scanned from a direction opposite to the direction in which the wafer is inserted. However, in the conventional wafer edge position sensor, the scanning direction of the CCD linear sensor is fixed, and, disadvantageously, the same wafer edge position sensor cannot use both the wafer made of an opaque material and the wafer made of a transparent material.

Additionally, in the conventional edge position sensing method mentioned above, if particles 1412 adhere to the CCD linear sensor 144 when the CCD is scanned in the direction opposite to the direction in which the wafer is inserted as shown in FIG. 15, the edge signal 1413 changes a plurality of times like the edge positions 1415 and 1416 of the particles, and, as a result, the first edge position 1416 is output, and the wafer edge position cannot be sensed correctly.

Additionally, in the conventional technique mentioned above, since the members constituting the prealignment sensor are unsuitable from the viewpoint of the purpose of use, gas is unfavorably emitted if the sensor is used in a vacuum, thus generating the cause of contaminating a vacuum environment. Additionally, since corrosion resistance is not high, problems arise when used in a chemical atmosphere. Therefore, difficulties lie in using the prealignment sensor in a vacuum or in a chemical atmosphere.

On the other hand, as shown in FIG. 21, light in the vicinity of a center axis of the diffused light admitted to the convex lens 183 from the light source 182 is reflected in the interior of the convex lens, and light is concentrated on the central part of the optical receiver. As a result, the luminous intensity level of the parallel light becomes uneven in the sensed range, and the received-light level of the optical receiver 185 varies, and, disadvantageously, sensing accuracy deteriorates.

DISCLOSURE OF INVENTION

It is therefore an object of the present invention to provide a wafer presence sensing method and a wafer presence sensing apparatus capable of easily sensing the presence or absence of a wafer by adding devices and processing to a prealignment sensor, and further provide a method according to which positional measurement with high precision can be performed by correcting an error between a proper measurement position and a measurement position in which an accumulation of the CCD linear sensor has been output.

It is another object of the present invention to provide a wafer edge position sensing method and a wafer edge position sensing apparatus capable of having high general-purpose properties by which wafers of both opaque and transparent materials can be used and capable of correctly sensing a wafer edge position without receiving any influence even if the surface of a wafer made of a transparent material is subjected to some surface treatment.

It is still another object of the present invention to provide a method according to which a wafer edge position can be correctly sensed even if particles or the like adhere to the CCD linear sensor.

It is still another object of the present invention to provide a prealignment sensor capable of being safely used in a vacuum environment and in a chemical atmosphere and capable of performing highly accurate sensing in such an environment or atmosphere.

In order to solve the aforementioned problems, the present invention is characterized in that a wafer prealignment apparatus comprises a wafer rotation means that can rotate a substantially circular wafer while holding the wafer on a table having a vertical rotational axis, a rotation sensing means for sensing a rotational angle of the wafer rotation means and transforming it into an electrical signal, a light projecting means for projecting light onto an edge of the wafer held by the wafer rotation means, a CCD linear sensor that consists of a great many pixels linearly arranged each of which has a fixed order and that reads a stored electric charge in order from a first pixel in accordance with a transfer pulse signal and then sequentially outputs stored electric charges of all pixels as electrical signals, and a signal processing means that repeatedly senses an edge position of the wafer at a plurality of arbitrary points over an outer circumference of the wafer and stores it in a built-in memory when a signal of the CCD linear sensor and a signal of the rotation sensing means are received, and, based on a sensed value, calculates at least one of an orientation flat position, a notch position, and a center position of the wafer, in which a photodiode is provided within a range where the light projecting means projects light and in the vicinity of the first pixel of the CCD linear sensor, and the signal processing means includes a luminous energy signal processing section for receiving a signal of the photodiode and sensing a quantity of light, a wafer edge sensing section for receiving a signal of the CCD linear sensor and sensing an edge of the wafer, a comparison judgment means for determining the presence or absence of the wafer by making a comparison between a luminous energy value of the photodiode and a signal of the wafer edge sensing section, and an output means for imparting a result thereof to an outside element, and the signal processing means further includes a light emission drive section for turning on or off the light projecting means.

A wafer presence judging method of the present invention is characterized in that a wafer prealignment apparatus comprises a wafer rotation means that can rotate a substantially circular wafer while holding the wafer on a table having a vertical rotational axis, a rotation sensing means for sensing a rotational angle of the wafer rotation means and transforming it into an electrical signal, a light projecting means for projecting light onto an edge of the wafer held by the wafer rotation means, a CCD linear sensor that consists of a great many pixels linearly arranged each of which has a fixed order and that reads a stored electric charge in order from a first pixel in accordance with a transfer pulse signal and then sequentially outputs stored electric charges of all pixels as electrical signals, a photodiode provided in the vicinity of the first pixel of the CCD linear sensor, and a signal processing means that repeatedly senses an edge position of the wafer at a plurality of arbitrary points over an outer circumference of the wafer and stores it in a built-in memory when a signal of the CCD linear sensor and a signal of the rotation sensing means are received, and, based on a sensed value, calculates at least one of an orientation flat position, a notch position, and a center position of the wafer, wherein the signal processing means determines that the wafer is absent if a luminous energy value of the photodiode is equal to a value obtained when light is admitted thereto when the edge of the wafer cannot be sensed, the signal processing means determines that the wafer is present if a luminous energy value of the photodiode is equal to a value obtained when light is shielded when the edge of the wafer cannot be sensed, the signal processing means determines that the wafer is present if a luminous energy value of the photodiode is equal to a value obtained when light is shielded when the edge of the wafer can be sensed, and the signal processing means determines that an unnecessary object adheres to the CCD linear sensor if a luminous energy value of the photodiode is equal to a value obtained when light is admitted thereto when the edge of the wafer can be sensed.

Further, the present invention is characterized in that a wafer prealignment apparatus comprises a wafer rotation means that can rotate a circular wafer while holding the wafer on a table having a vertical rotational axis, a rotation sensing means for sensing a rotational angle of the wafer rotation means and transforming it into an electrical signal, a light projecting means for projecting light onto an edge of the wafer held by the wafer rotation means, a CCD linear sensor that consists of a great many pixels linearly arranged each of which has a fixed order and that reads a stored electric charge in order from a first pixel in accordance with a transfer pulse signal and then sequentially outputs stored electric charges of all pixels as electrical signals, and a signal processing means that repeatedly senses an edge position of the wafer at a plurality of predetermined sensed positions over an outer circumference of the wafer and stores it in a built-in memory when a signal of the CCD linear sensor and a signal of the rotation sensing means are received, and, based on a sensed value, calculates at least one of an orientation flat position, a notch position, and a center position of the wafer, wherein the signal processing means includes a first timer for measuring time from measurement commands corresponding to the plurality of predetermined measurement positions over the outer circumference of the wafer to an ROG signal that is a timing signal used when the stored electric charge of the pixel is transformed into an electrical signal in the CCD linear sensor and a second timer for measuring time between the measurement commands corresponding to the plurality of predetermined measurement positions over the outer circumference of the wafer.

The present invention is further characterized in that the signal processing means has a function to correct an angular error between a position in a circumferential direction where the stored electric charge of the CCD linear sensor has been output and a measurement position by use of the time measured by the first timer and the time measured by the second timer when the signal processing means receives the ROG signal.

The present invention is further characterized in that an angular error $\phi$[deg] between the plurality of predetermined measurement positions over the outer circumference of the wafer and the position where the stored electric charge of the CCD linear sensor has been output by the ROG signal is defined as $\phi=\theta\times(\tau/T)$ where $\theta$[deg] is an angle between the plurality of predetermined measurement n positions over the outer circumference of the wafer, $\tau$[sec] is time measured by the first timer, and T[sec] is time measured by the second timer, and an error of a rotational angle where an electric charge of the CCD linear sensor has been read is corrected by adding $\phi$ to the plurality of predetermined measurement positions over the outer circumference of the wafer.

The presence or absence of the wafer can be sensed by these means without providing a wafer presence sensor besides the prealignment sensor, and the error of the measured position can be corrected without synchronizing the measurement command with the driving cycle of the CCD linear sensor, thus making it possible to perform highly accurate measurement.

Further, there is provided a wafer edge position sensing method of the present invention performed in a wafer prealignment apparatus, including: rotatable stage on which a substantially circular wafer is placed; a light source to project light onto a periphery of the wafer; a CCD linear sensor provided at an outer circumference of the wafer so as to face the light source, for receiving light of the light source, successively scanning cells arranged from an end on a side of the outer circumference of the wafer to an opposite end on a side of an inner circumference of the wafer, and outputting sensed data of the cells obtained by cell numbers of the cells and a bright and dark image formed by the light; and a signal processing board connected to a calculator, for inputting the cell numbers and the sensed data and performing data processing; the wafer edge position sensing method comprising: sensing a position of the outer circumference of the wafer by an edge where the sensed data changes from LO (or HI) to HI(or LO); wherein the cell number and the sensed data concerning the edge are recorded, and, if the edge is plural in number during one scanning, the sensed data corresponding to a last edge that is an edge nearest to the side of the inner circumference that is a scanning end during the one scanning is regarded as a position of the outer circumference of the semiconductor wafer.

Further, there is provided a wafer edge position sensing apparatus having a wafer prealignment apparatus which includes: a rotatable stage on which a substantially circular wafer is placed; a light source to project light onto a periphery of the wafer; a CCD linear sensor provided at an outer circumference of the wafer so as to face the light source, for receiving light of the light source, successively scanning cells arranged from an end on a side of the outer circumference of the wafer to an opposite end on a side of an inner circumference of the wafer, and outputting sensed data of the cells obtained by cell numbers of the cells and a bright and dark image formed by the light; and a signal processing board connected to a calculator, for inputting the cell numbers and the sensed data and performing data processing; for sensing a position of the outer circumference of the wafer by an edge where the sensed data changes from LO (or HI) to HI (or LO); the wafer edge position sensing apparatus comprising: the signal processing board that inputs the cell number and the sensed data concerning the edge and outputs the sensed data and a scan end signal; a data update section in the signal processing board that outputs the sensed data corresponding to a last edge that is an edge nearest to the side of the inner circumference that is a scanning end during one scanning when the scan end signal is input; a memory provided in the calculator, for inputting and storing all of the sensed data of the data update section to be input during each scanning and outputting all of the sensed data when a series of scans repeated while the stage is making one rotation are ended; and a data processing section for executing predetermined arithmetic processing when all of the sensed data output by the memory are output.

Therefore, wafers of both opaque and transparent materials can be handled with simple operation by use of the same wafer prealignment apparatus, and a wafer edge position can be correctly sensed without receiving any influence even if the surface of a wafer made of a transparent material is subjected to some surface treatment.

A wafer edge position sensing method of the present invention is characterized in that a prealignment sensor comprises a light source and a CCD linear sensor that receives light of the light source and outputs sensed-position information and sensed data while sequentially scanning from one end to an opposite end in which, if an outer circumference of a semiconductor wafer is situated between the light source and the CCD linear sensor, a position of the outer circumference of the semiconductor wafer is sensed by an edge in which the sensed data is changed from LO (or HI) to HI (or LO), wherein the sensed-position information regarding an edge where the sensed data is changed from LO (or HI) to HI (or LO) is recorded when the CCD sensor sequentially outputs the sensed-position information and the sensed data, and, if the edge is plural in number, the sensed-position information corresponding to the edge last in order is set as the position of the outer circumference of the semiconductor wafer.

A wafer edge position sensing method of the present invention is further characterized in that the scanning is repeatedly performed a plurality of times while the semiconductor wafer substantially shaped like a disk is making one rotation, and the sensed-position information corresponding to the edge is recorded in accordance with the scanning.

Further, a computer-readable record medium recording a program for executing the wafer edge position sensing method of the present invention is characterized in that a program for executing a method as set forth in claim 9 or claim 10 is computer-readably written.

A wafer edge position sensing apparatus of the present invention is further characterized in that a prealignment sensor comprises a light source and a CCD linear sensor that receives light of the light source and outputs sensed-position information and sensed data while sequentially scanning from one end to an opposite end in which, if an outer circumference of a semiconductor wafer is situated between the light source and the CCD linear sensor, a position of the outer circumference of the semiconductor wafer is sensed by an edge in which the sensed data is changed from LO (or HI) to HI (or LO), wherein the apparatus comprises a signal processing means that inputs the sensed-position information and the sensed data and outputs the sensed-position information regarding an edge where the sensed data is changed from LO (or HI) to HI (or LO) and a scan end signal, a data update section for outputting the latest information of the position information during one scan when the scan end signal is input, a memory for storing all of the position information of the data update section to be input during each scan and outputting all of the position information when a series of scans end, and a data processing section for executing predetermined arithmetic processing when all of the position information output by the memory is input.

A prealignment sensor of the present invention is further characterized in that the prealignment sensor comprises a frame fixed to a base and having a U-shape when viewed from its side, a light source attached to a lower part (or upper part) of the frame, a convex lens attached to a lower part of an inside (or upper part of an inside) of the frame by which diffused light of the light source is transformed into parallel rays of light, a lens holder for fixing the convex lens to the frame, an optical receiver attached to an upper part of an inside (or lower part of an inside) of the frame by which the parallel light is received and is transformed into an electrical signal, and a signal processing circuit attached to the frame by which the electric signal is transformed into a desired displacement magnitude, wherein the frame is made of aluminum subjected to sulfuric-acid hard alumite treatment and then to steam sealing.

This prealignment sensor of the present invention is characterized in that the lens holder is made of a fluororesin, the signal processing circuit is covered with an epoxy resin, and the epoxy resin is an alumina-filled epoxy resin.

The prealignment sensor of the present invention is further characterized in that the convex lens is disposed such that a center position thereof is slightly offset from a center of an optical axis connecting a center of the light source and a center of the optical receiver in a horizontal direction perpendicular to a sensed direction.

As described above, according to the present invention, the wafer prealignment apparatus has a wafer presence sensing function made up of the light emission drive section, the wafer edge sensing section, the photodiode, the luminous energy signal processing section, the comparison judgment means, and the output means, and it is determined that the wafer is absent if the wafer edge sensing section cannot sense a wafer edge, and the luminous energy value of the photodiode is equal to a value obtained when light is admitted thereto, it is determined that the wafer is present if the wafer edge sensing section cannot sense a wafer edge, and the luminous energy value of the photodiode is equal to a value obtained when light is shielded, it is determined that the wafer is present if the wafer edge sensing section senses a wafer edge, and the luminous energy value of the photodiode is equal to a value obtained when light is shielded, and it is determined that unnecessary objects adhere to the CCD linear sensor if the wafer edge sensing section senses a wafer edge, and the luminous energy value of the photodiode is equal to a value obtained when light is admitted thereto, and judgment results are output to the system controller. Therefore, advantageously, the presence or absence of the wafer can be sensed without providing the wafer presence sensor besides the prealignment apparatus, and the apparatus can be reduced in size and in cost.

Further, according to the present invention, the time measuring means is provided which comprises the timer for measuring time between the measurement command and the ROG signal and the timer for measuring time between measurement commands corresponding to measurement positions, and an angular error between a proper measurement position and a position where the electric charge of the CCD linear sensor has been read is corrected by using time obtained by the timer that measures time between the measurement command and the ROG signal of the CCD linear sensor corresponding to the plurality of predetermined sensed positions over the outer circumference of the wafer and time obtained by the timer that measures time between measurement commands corresponding to the plurality of predetermined measurement positions over the outer circumference of the wafer. Therefore, advantageously, signal processing can be simplified so that prealignment time can be shortened, and the wafer prealignment apparatus having a prealignment sensor of high precision can be provided.

Further, according to the present invention, the CCD linear sensor is disposed at a position where it can make a turnabout of 180 degrees, and, when the CCD line sensor makes a turnabout of 180 degrees, the binary output signal of the CCD linear sensor is reversed, and the same signal is output at the same position prior to the turnabout. Therefore, advantageously, a wafer can be handled in spite of the fact that the wafer is made of either an opaque material or a transparent material, and the edge position of the wafer can be sensed with high general-purpose properties.

Further, according to the present invention, even if a binarized wafer edge signal changes at a plurality of positions because particles have adhered to the CCD linear sensor, a latest change point can be sensed as a wafer edge position. Therefore, the edge position of the wafer can be sensed correctly.

Further, according to the prealignment sensor of the present invention, the sensor can stably operate in a vacuum, in a chemical atmosphere, or in a similar environment, and therefore a great effect can be achieved by which more highly accurate displacement sensing can also be performed.

BEST MODE FOR CARRYING OUT THE INVENTION

Figure 1:
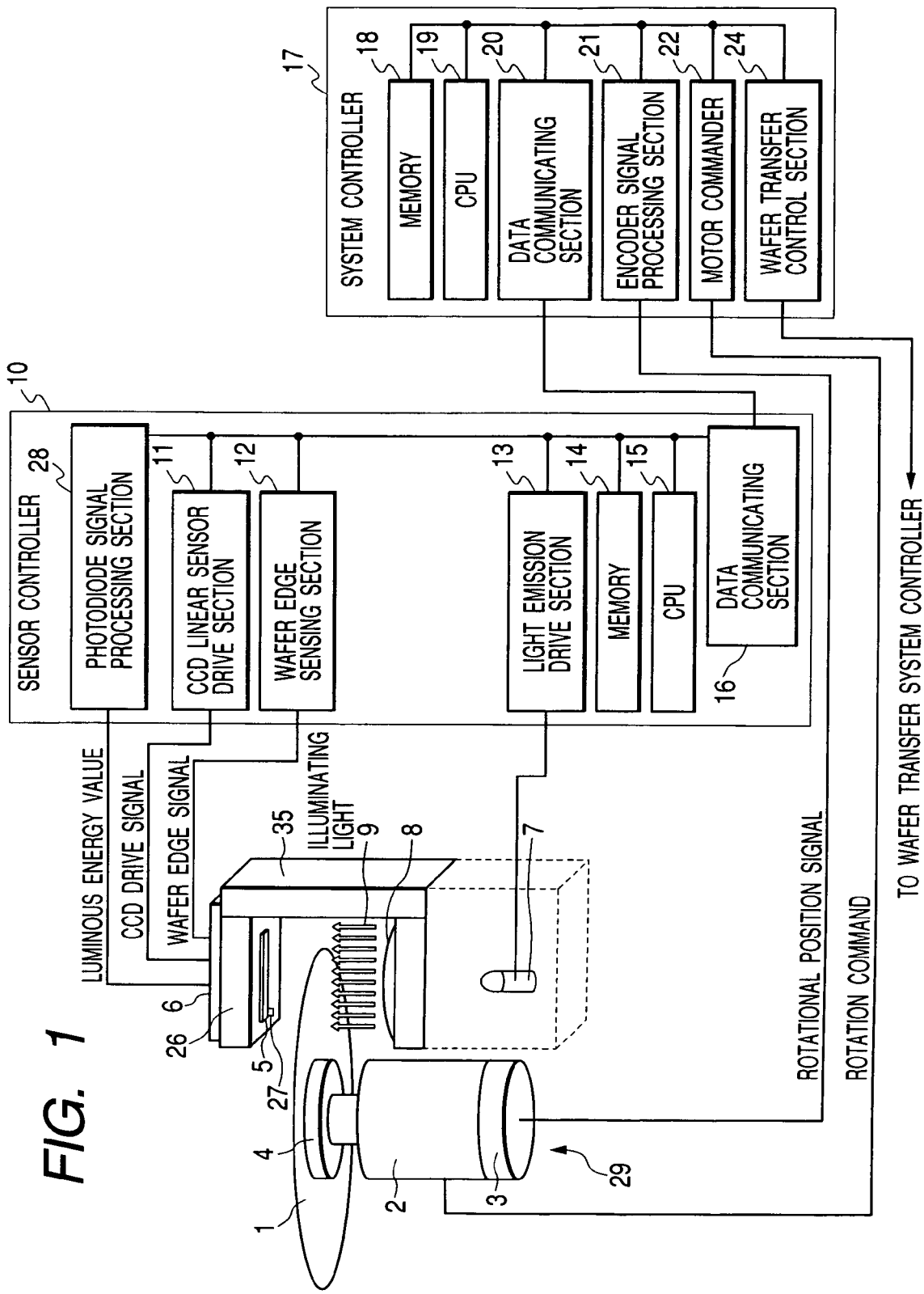
FIG. 1 is a block diagram showing the structure of a wafer prealignment apparatus of the present invention.
Figure 2:
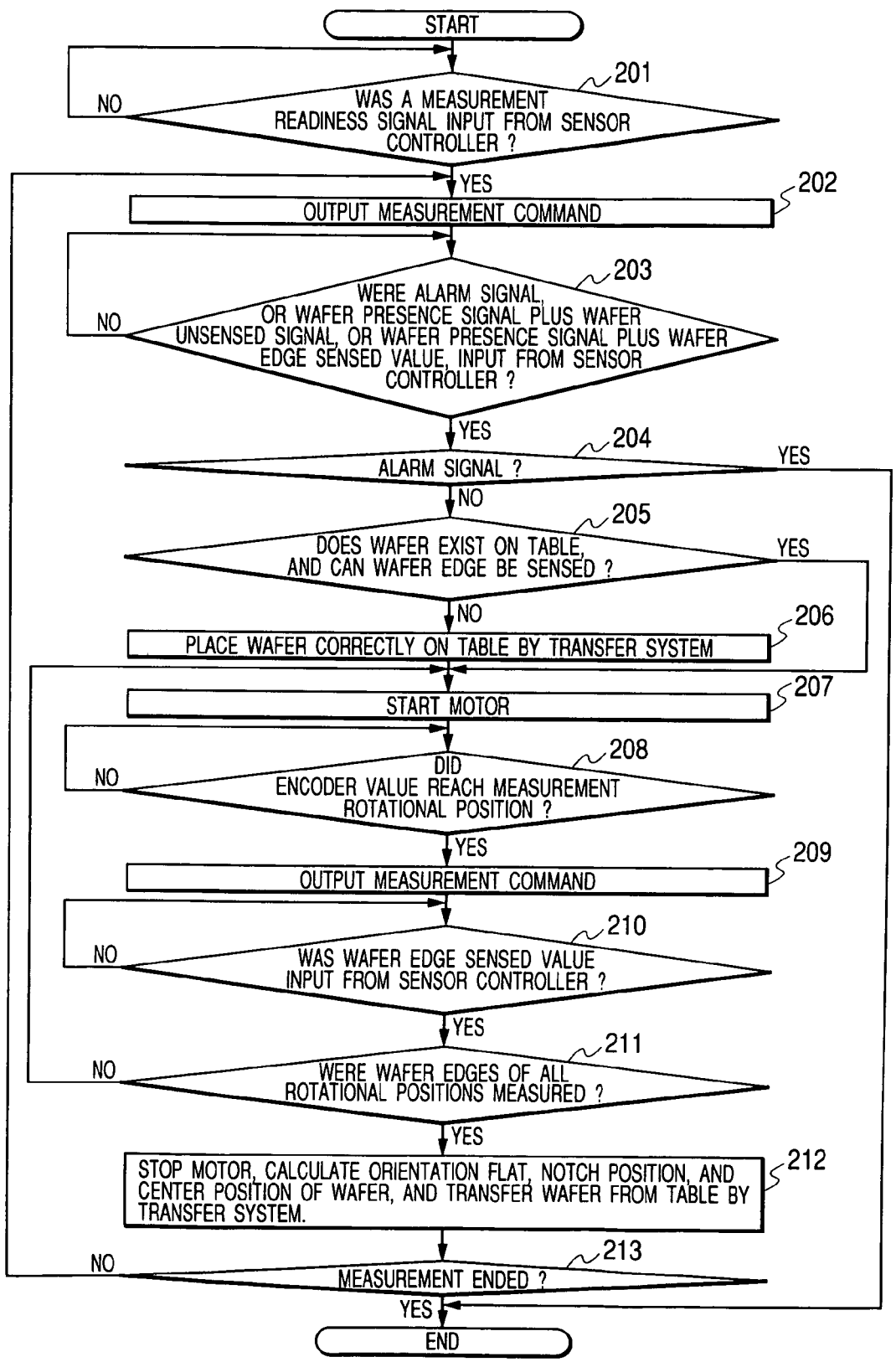
FIG. 2 is a flowchart showing a processing procedure of a system controller.
Figure 3:
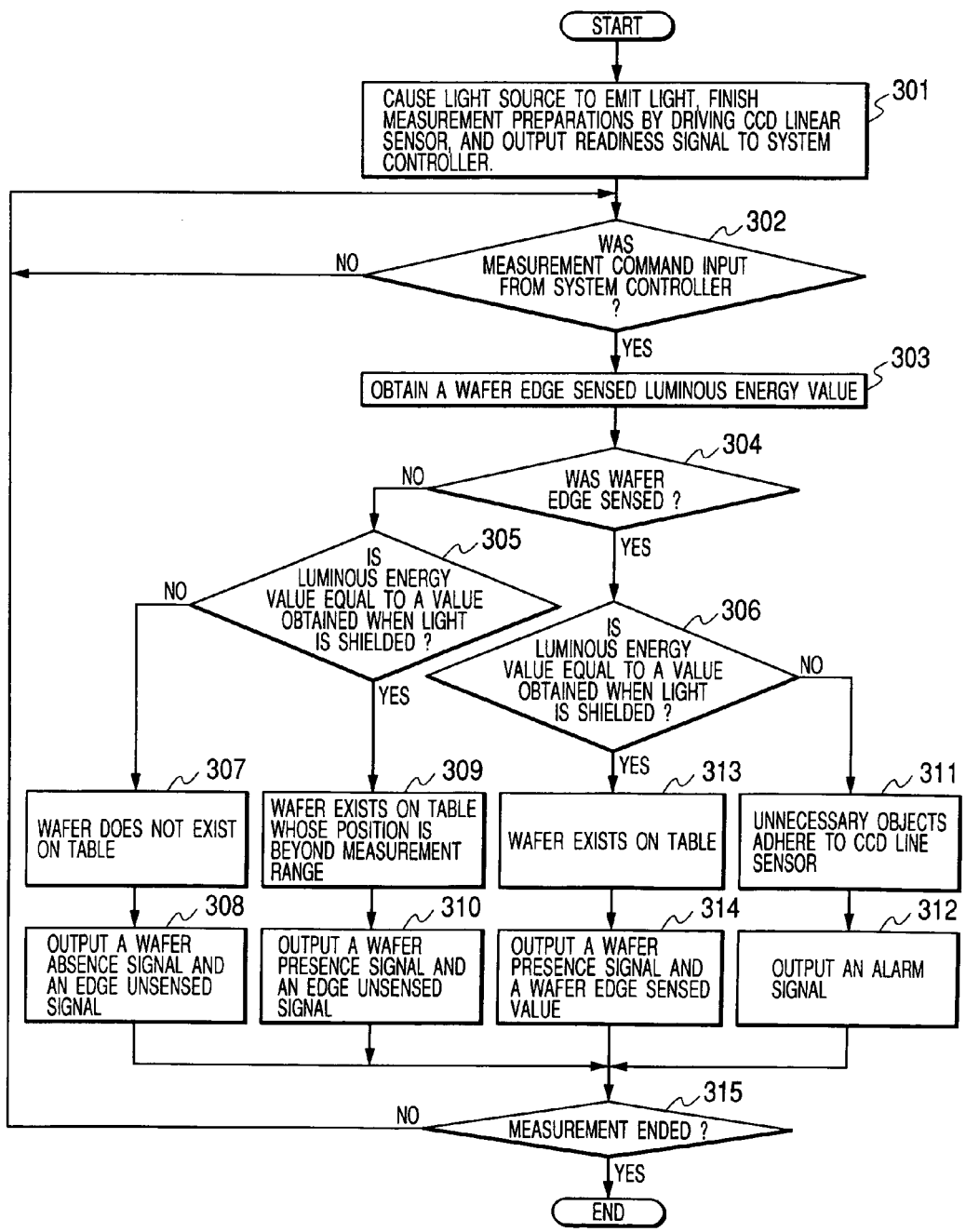
FIG. 3 is a flowchart showing a processing procedure of a sensor controller.

Embodiments of the present invention will hereinafter be described with reference to the attached drawings. FIG. 1 is a block diagram showing the structure of a wafer prealignment apparatus which is a first embodiment of the present invention. FIG. 2 is a flowchart showing the processing procedure of a system controller used in the wafer prealignment apparatus of the present invention, and FIG. 3 is a flowchart showing the processing procedure of a sensor controller used in the wafer prealignment apparatus of the present invention.

In FIG. 1, reference numeral 29 is a wafer positioning mechanism made up of a table 4 rotated by a motor 2 while holding a wafer 1 to be measured and an encoder 3 connected to the motor 2 and used for sensing the rotational position of the motor 2. Reference numeral 26 is a prealignment sensor made up of a frame 35 having a U-shape when viewed from its side, a light source 7 disposed at the lower part of the frame, a lens 8 by which light of the light source 7 is changed into parallel light, a CCD linear sensor 5 that receives the parallel light, and a photodiode 27 disposed in the vicinity of a first pixel of the CCD linear sensor 5. The CCD linear sensor 5 consists of a great many pixels linearly disposed each of which has a fixed order, and reads a stored electric charge substantially proportional to the incident light from the light source 7 while scanning in order from the first pixel, and sequentially outputs the stored electric charges of all pixels as electrical signals.

Reference numeral 10 is a sensor controller made up of a CCD linear sensor drive section 11 for driving the CCD linear sensor 5, a wafer edge sensing section 12 for sensing a wafer edge signal of a point where a signal is changed by scanning from the first pixel to the last pixel of the CCD linear sensor 5, a light emission drive section for turning on or off the light projection of the light source 7, a photodiode signal processing section 28 for obtaining a luminous energy value of the photodiode 27, a memory 14 that stores a luminous energy value indicated when light of the light source 7 is received by the photodiode 27 and a luminous energy value indicated when the light is shielded by the wafer 1, a CPU15 used to determine whether a wafer is present or absent by use of a signal of the wafer edge sensing section 12 and a signal of the memory 14, and a data communicating section 16 for communicating signals with an outside element.

Reference numeral 17 is a system controller made up of a motor commander 22 by which the motor 4 is rotated, an encoder signal processing section 21 for processing a rotational position signal of the encoder 3, a memory 16 that prestores a measurement rotational position and stores a wafer edge sensed value in relation to the measurement rotational position, a CPU 19, a data communicating section 20 for communicating a signal with the sensor controller 10. The CPU 19 calculates at least one of an orientation flat, a notch position, and a center position of the wafer from the measurement rotational position and the wafer edge sensed value stored in the memory 16, and sends a command to a wafer conveying system not shown so as to convey the wafer 1 placed on the table 4 to a destination.

The wafer positioning mechanisms 29, the prealignment sensor 26, the sensor controller 10, and the system controller 17 constitute the wafer prealignment apparatus.

Referring to the flowchart of FIG. 2, a description will be given of the processing procedure of the system controller 17.

201: The sensor controller 10 first receives information regarding whether measurement preparation has been finished or not and confirms that the sensor controller 10 is in a measurable state.

202: Subsequently, a measurement command is output to the sensor controller 10 to examine whether the wafer 1 exists in the wafer positioning mechanism 29 or not.

203: Waiting is made until wafer presence/absence information is input from the sensor controller 10.

204: Measurement is ended if the wafer presence/absence information that has been input is an alarm signal.

205: Herein, from the wafer presence/absence information that has been input, it is determined whether the wafer 1 exists on the table 4 or not, or whether the wafer 1 occupies a normal position thereon or even if it does not exist. If the wafer 1 does not exist on the table 4 or occupies an abnormal position, processing proceeds to step 206, and, if it exists thereon or occupies the normal position, processing proceeds to step 207.

206: The wafer conveying system not shown conveys the wafer 1 to the normal position on the table 4.

207: The wafer positioning mechanism is rotated by the motor commander 22.

208: A comparison is made between the rotational position of the encoder signal processing section 21 and the measurement rotational position prestored in the memory 16. If the positions coincide with each other, processing proceeds to step 209, and, if not, processing returns to step 208.

209: A measurement command is output to the sensor controller 10.

210: Waiting is made until a wafer edge sensed value is input from the sensor controller 10. When this is input, the wafer edge sensed value is stored in the memory 16 in relation to the measurement rotational position.

211: If the measurement of all measurement rotational positions prestored in the memory 16 is completed, processing proceeds to step 212, and, if not, processing returns to step 207, and procedures of steps 207 to 211 are repeated.

212: The CPU 19 calculates at least one of the orientation flat, the notch position, and the center position of the wafer by use of the measurement rotational position and the wafer edge sensed value in the memory 16. Thereafter, the wafer conveying system not shown conveys the wafer 1 on the table 4 to a next destination.

213: If all necessary prealignment jobs are finished, the series of steps are ended, and, if not, processing returns to step 202, and procedures of steps 202 to 213 are repeated.

Next, referring to the flowchart of FIG. 3, a description will be given of the processing procedure of the sensor controller 10.

301: Light is first emitted by the light source 7, measurement is then prepared by driving the CCD linear sensor 5, and a readiness signal is output to the system controller 17.

302: Thereafter, waiting is made until a measurement command is input from the system controller 17. If the signal is input, processing proceeds to step 303, and, if not, processing returns to step 302.

303: The wafer edge sensing section 12 starts measurement, and a wafer edge signal of the CCD linear sensor 5 which changes between the first pixel and the last pixel is sensed. If it cannot be sensed, an unsensed signal is output to the CPU 15. Simultaneously, a luminous energy value of the photodiode 27 is acquired and is output to the CPU 15.

304: The CPU 15 determines whether a wafer edge has been sensed or not. If not sensed, processing proceeds to step 305, and, if sensed, processing proceeds to step 306.

305: A comparison is made among the luminous energy value of the photodiode 27 that has been acquired, the luminous energy value prestored in the memory 14 when illuminating light 9 is striking the photodiode by emitting light from the light source 7, and the luminous energy value obtained when the illuminating light 9 is shielded by the wafer 1. If they are equal to the value obtained when light is admitted thereto, processing proceeds to step 307, and, if not, processing proceeds to step 309.

306: A comparison is made among the luminous energy value of the photodiode 27 that has been acquired, the luminous energy value prestored in the memory 14 when illuminating light 9 is striking the photodiode by emitting light from the light source 7, and the luminous energy value obtained when the illuminating light 9 is shielded by the wafer 1. If they are equal to the value obtained when light is admitted thereto, processing proceeds to step 311, and, if not, processing proceeds to step 313.

307: It is judged that the wafer 1 does not exist on the table 4.

308: A wafer absence signal and an edge unsensed signal are output to the system controller 17, and processing proceeds to step 315.

309: It is judged that the wafer 1 exists on the table 4, but the table 4 occupies an abnormal position in a state where the wafer edge is beyond the measurement range of the CCD linear sensor.

310: A wafer presence signal and an edge unsensed signal are output to the system controller 17, and processing proceeds to step 315.

311: A wafer edge is sensed in spite of the fact that the wafer 1 does not exist on the table 4, and it is judged that an unnecessary object adheres to the CCD line sensor 5.

312: An alarm signal is output to the system controller 17, and processing proceeds to step 315.

313: It is judged that the wafer 1 is on the table 4, a wafer edge is within the measurement range of the CCD linear sensor, and the table 4 is at a normal position.

314: A wafer presence signal and a wafer edge sensed value are output to the system controller 17, and processing proceeds to step 315.

315: If the system controller 17 judges that all necessary prealignment jobs have been finished, and a command to end the measurement is received, the series of steps are ended. If not, processing returns to step 302, and the procedure of steps 302 to 315 is repeated.

With this structure, the wafer prealignment apparatus of the present invention operates as follows. In order to determine whether the wafer 1 exists on the table 4, the system controller 17 first outputs a measurement command to the sensor controller 10. The sensor controller 10 receives the command, then controls the prealignment sensor 26 to allow the light source 7 to emit light, and drives the CCD linear sensor 5 for measurement preparation. Measurement starts when the measurement command is input. The wafer edge sensing section 12 senses a wafer edge signal, and outputs an unsensed signal if the signal is not sensed. Simultaneously, the photodiode signal processing section 28 obtains a luminous energy value of the photodiode 27. The CPU 15 makes a comparison among the wafer edge sensed value or the unsensed signal output by the wafer edge sensing section 12, the obtained luminous energy value of the photodiode 27, the luminous energy value prestored in the memory 14 when illuminating light 9 is striking the photodiode by allowing the light source 7 to emit light, and the luminous energy value indicated when the illuminating light 9 is shielded by the wafer 1, and thereby determines that the wafer is present or absent. The result is output to the system controller 17. The system controller 17 receives its information and starts a prealignment job.

Figure 4:
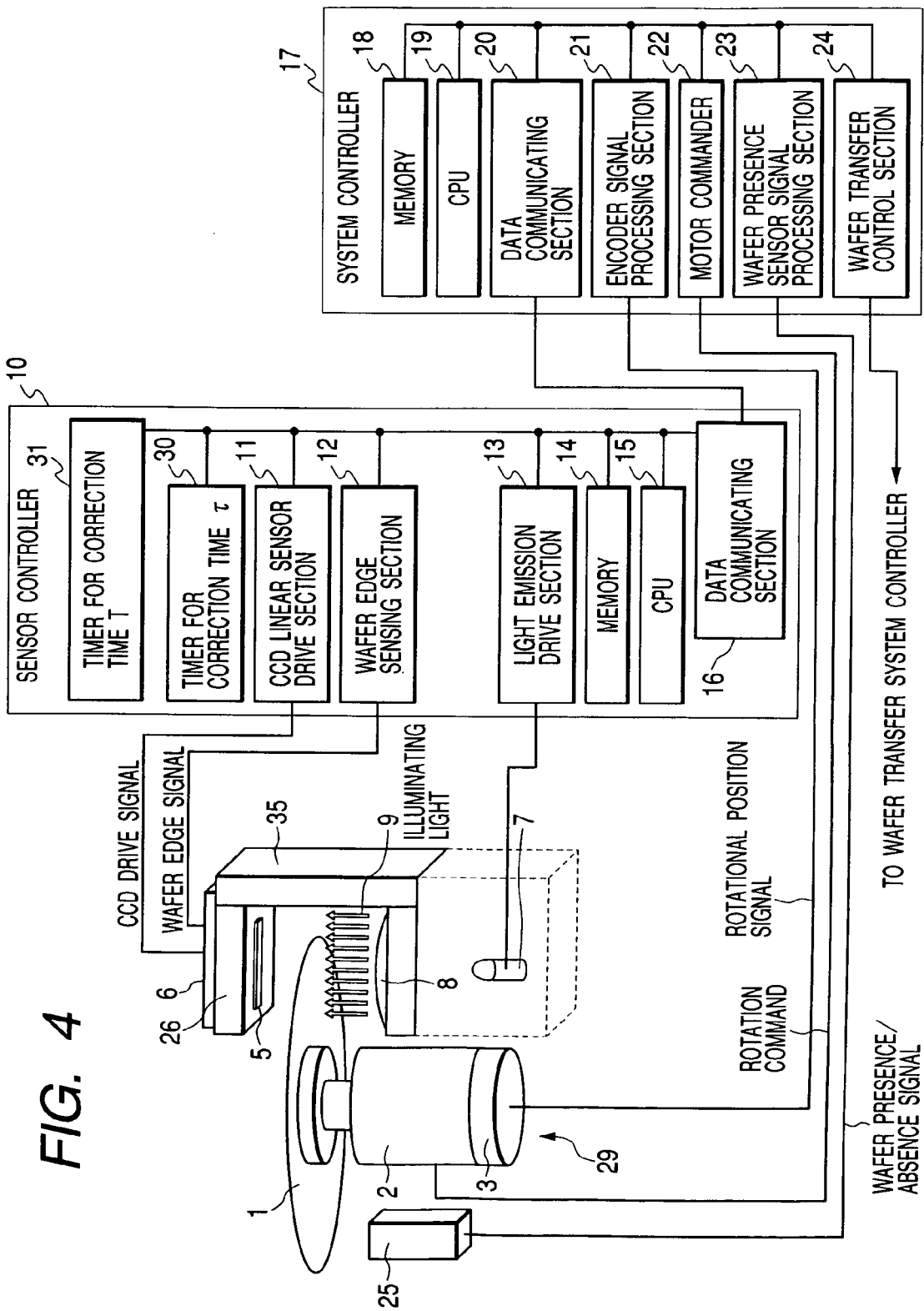
FIG. 4 is a block diagram showing the structure of the second embodiment of the present invention.
Figure 5:
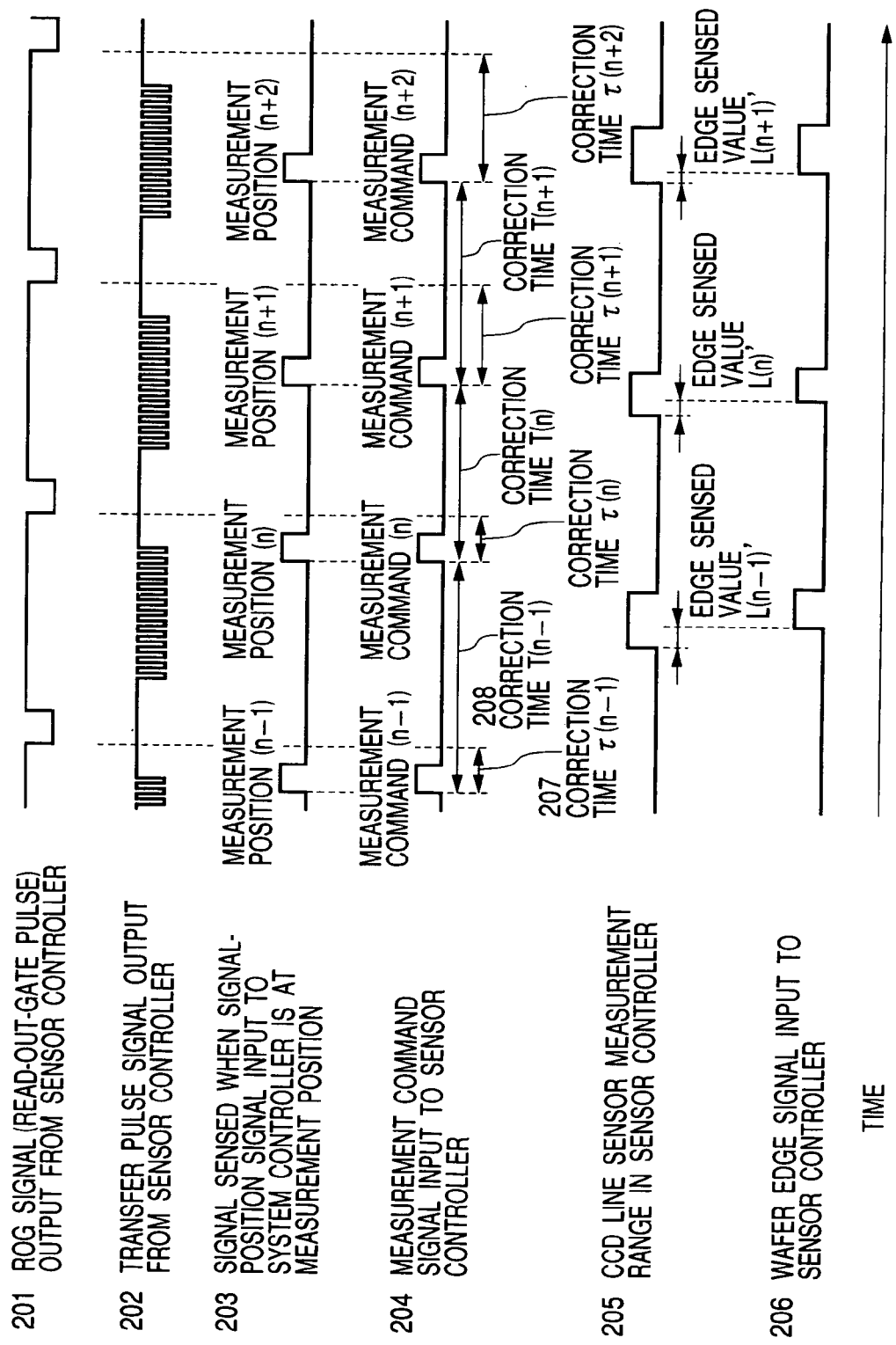
FIG. 5 is a time diagram explaining correction time T, τ in the second embodiment.
Figure 6:
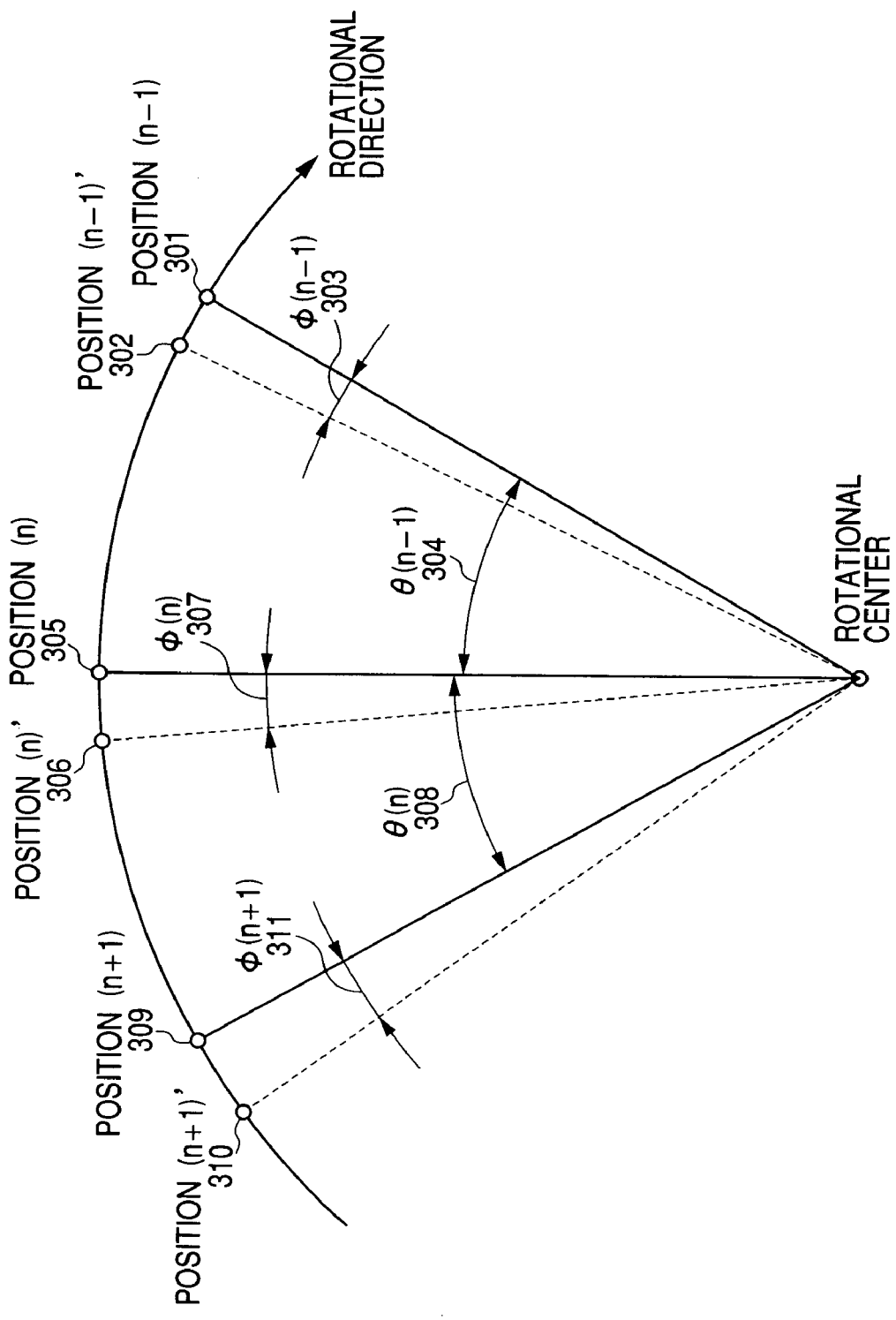
FIG. 6 is a diagram explaining the relationship between measurement positions and angles to be corrected in the second embodiment.

Next, a second embodiment of the present invention will be described with reference to the drawings. FIG. 4 is a block diagram showing the structure of the wafer prealignment apparatus of the present invention, FIG. 5 is a time diagram explaining correction time T and τ, and FIG. 6 is a diagram explaining the relationship between measurement positions and angles to be corrected.

In FIG. 4, reference numeral 29 is a wafer positioning mechanism made up of the motor 2, the table 4 to be rotated by the motor 2 while holding the wafer 1 which is an object to be measured, and the encoder 3 used to sense the rotational position of the motor together with the motor 2.

Reference numeral 26 is a prealignment sensor made up of the light source 7, the lens 8 by which the diffused light is changed into parallel rays of light, the CCD linear sensor 5, and the frame 35 having a U-shape when they are viewed from the mounting side. The parallel light between the lens 8 and the CCD linear sensor 5 is shielded by the outer circumference of the wafer 1 held on the table 4.

Reference numeral 10 is a sensor controller formed of the CCD linear sensor drive section 11 serving to store an electric charge during a fixed time most suitable for the CCD linear sensor 5 by outputting a read-out-gate signal (ROG signal), which is a timing signal used when the stored electric charge of the pixel is transformed into an electrical signal at regular periodic intervals, and a transfer pulse signal to the CCD linear sensor 5 and serving to sequentially output stored electric charges of all pixels of the CCD linear sensor as electrical signals, a timer 31 used for correction time T that measures time T between measurement commands corresponding to a plurality of predetermined measurement positions over the outer circumference of the wafer, a timer 30 used for correction time τ that measures time τ between a measurement command corresponding to a measurement position and the ROG signal, the wafer edge sensing section 12 that senses a wafer edge signal varying between the first pixel and the last pixel of the CCD linear sensor 5 with the measurement command as a trigger, the light emission drive section 13 that can turn on or off the light projection of the light source 7, the memory 14 that stores time T, time τ, and a wafer edge sensed value, the CPU 15 that reads the data and simultaneously outputs a value needed to calculate the correction of sensed positions of the wafer edge, and the data communicating section 16 that communicates signals with the system controller 17.

Reference numeral 17 is a system controller formed of the motor commander 22 by which the motor 4 is rotated, the encoder signal processing section 21 for processing a rotational position signal of the encoder 3, the memory 16 that prestores an angle θ[deg] between rotational positions to be measured and measurement rotational positions and stores correction time T, correction time τ, and a wafer edge sensed value obtained at the measurement rotational position in relation to the measurement rotational position, the CPU 19, and the data communicating section 20 that communicates signals with the sensor controller 10. The CPU 19 calculates at least one of an orientation flat, a notch position, and a center position of the wafer from the measurement angle θ[deg] between rotational positions, the measurement rotational position, correction time T, correction time τ, and the wafer edge sensed value that are stored in the memory 16, thereafter sends a command to the wafer conveying system, not shown, so as to convey the wafer 1 placed on the table 4 to a destination.

The wafer positioning mechanism 29, the prealignment sensor 26, the sensor controller 10, and the system controller 17 constitute the wafer prealignment apparatus.

A description will now be given of a processing method of the wafer prealignment apparatus of the present invention with reference to the time diagram shown in FIG. 5 and the relational drawing shown in FIG. 6.

The light emission drive section 13 allows the light source 7 to always emit light and project the constant illuminating light 9 to the CCD linear sensor 5. The CCD linear sensor drive section 11 outputs an ROG signal 201 and a transfer pulse signal 202 to the CCD linear sensor 5 at regular periodic intervals, and allows the CCD linear sensor 5 to uniformly and most suitably store electric charges and read wafer edge signals repeatedly, regardless of whether measurement is performed or not.

When the wafer 1 is on the table 4, the system controller 17 makes a comparison between the rotational position of the motor 2 to be rotated and a measurement position (n+1) 309 stored in the memory 14. If it is judged that it is rotated to the same position, a measurement command 204 is output to the sensor controller 10.

When a measurement command corresponding to the measurement position (n+1) 309 is input, the sensor controller 10 starts measurement. A wafer edge signal 206 is sensed by the wafer edge sensing section 12, and a wafer edge sensed value is measured. Simultaneously, the timer 31 for correction time T measures correction time T(n) 208 which is a time interval between a measurement command corresponding to the measurement position (n+1) 309 and a measurement command corresponding to a measurement position (n) 305, whereas the timer 30 for correction time τ measures correction time τ(n+1) 207 which is gap time between the measurement command corresponding to the measurement position (n+1) 309 and the most recent ROG signal output by the CCD linear sensor drive section 11.

Since the CCD linear sensor 5 is herein driven by an ROG signal, which is asynchronous to the input of the measurement command and is regularly periodic, and by a transfer pulse signal, the wafer edge sensed value actually obtained by the measurement command input at the measurement position (n+1) 309 becomes equal to a wafer edge sensed value L(n+1)' of a measurement position (n+1)' 310 that has a delay of an angle φ(n+1) [deg] corresponding to a rotation during correction time τ(n+1).

Subsequently, the wafer edge sensed value L(n+1)', correction time T(n), and correction time τ(n+1) that have been measured by the CPU 15 are stored in the memory 14. If there is a measurement command corresponding to the measurement position (n) 305 until a measurement command corresponding to the next measurement position (n+1) 309 is input, a wafer edge sensed value L(n)', correction time T(n), and correction time τ(n) that have been measured in the same manner and have been stored in the memory 14 are read from the memory 14. They are then output to the system controller 17 as values used for correcting the wafer edge sensed position of the measurement position (n) 305.

When the wafer edge sensed value L(n)', correction time T(n), and correction time τ(n), which have been measured by the measurement command corresponding to the measurement position (n) 305, are input, the system controller 17 calculates φ(n)[deg] according to Equation (1) based on θ(n)[deg] 301, T(n), and τ(n) between the measurement position (n) 305 and the measurement position (n+1) 309 which are situated on the outer circumference of the wafer and have been predetermined by the system.

$$\phi(n) = \theta(n) \times (\tau(n)/T(n)) \tag{1}$$

where θ(n) [deg] 301 is an angle prestored in the memory 18, T(n) and τ(n) are data correction time, and correction time, respectively, that have been input, and φ(n) [deg] is an angular error between the measurement position (n) 305 and the position where the electric charge of the CCD linear sensor has been read by an ROG signal. Thereafter, the measurement-position angular error is corrected by adding φ(n) to the measurement position (n), and the measurement position (n)' subjected to the correction and the wafer edge sensed value L(n)' are stored in the memory 18. The same operation is repeated until the wafer 1 makes one rotation or more, and outer-circumference data corresponding to one rotation of the wafer is recorded in the memory 18. Based on this outer-circumference data corresponding to one rotation of the wafer recorded in the memory 18, the CPU 19 calculates at least one of the center position, orientation flat, and notch position of the wafer 1.

Figure 7:
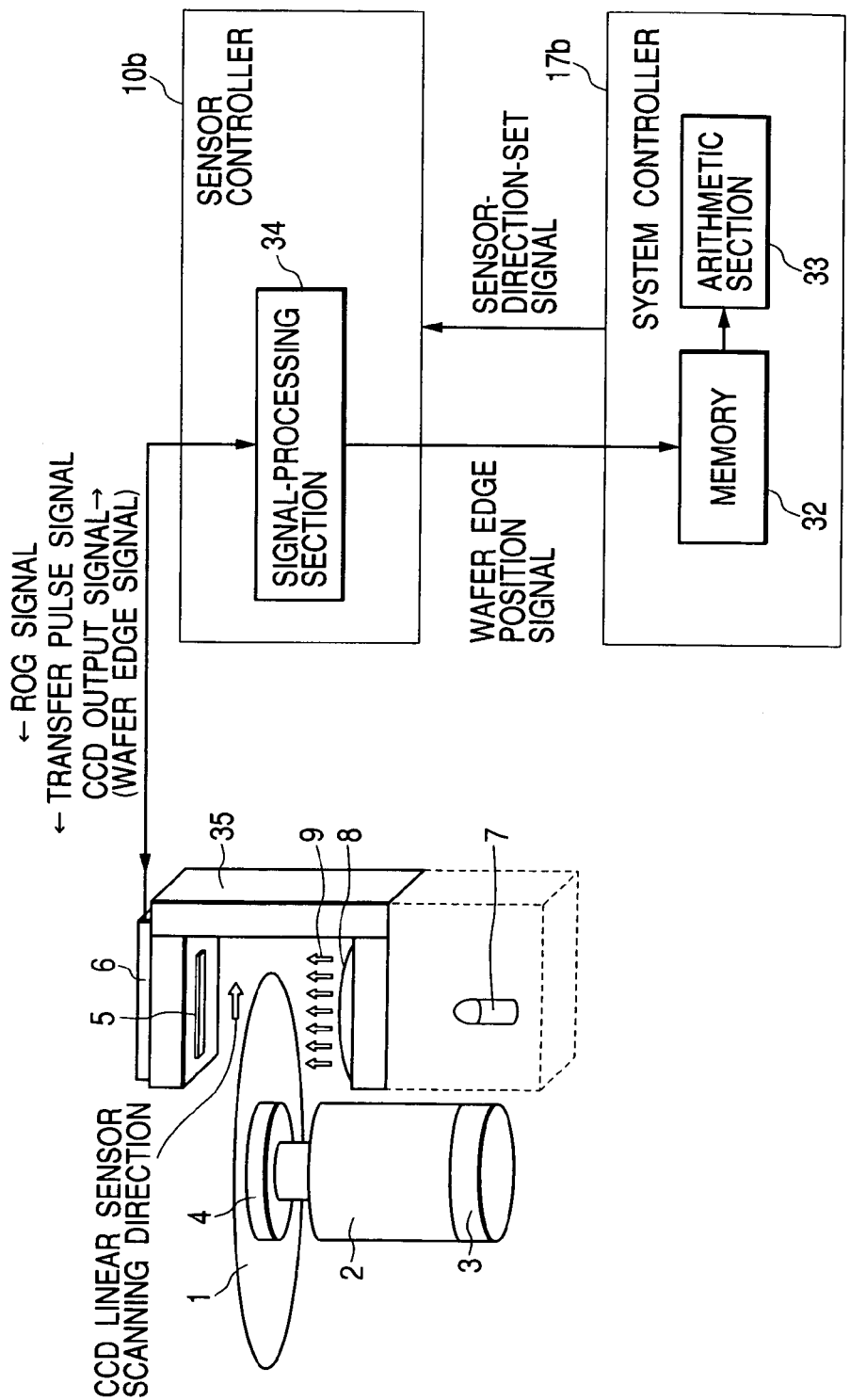
FIG. 7 is a block diagram showing the structure of a wafer prealignment apparatus for executing a wafer-edge-position-sensing method of the present invention.

Next, a third embodiment of the present invention will be described with reference to the drawings. FIG. 7 is a block diagram showing the structure of the wafer prealignment apparatus of the present invention. In the Figure, the wafer 1, which is an object to be measured, is placed on the table 4 rotatable by the motor 2. The CCD linear sensor 5 with the wafer 1 situated therebetween and the lens 8 by which the diffused light of the light source 7 is changed into parallel rays of light, are disposed at the upper part and lower part, respectively, of the inside of the frame 35 having a U-shape when viewed from its side. Light emitted by the light source 7 is shielded by the wafer 1, a bright and dark image is then projected to the CCD linear sensor 5, and a signal corresponding to this image is output from the CCD linear sensor 5. The output signal of the CCD linear sensor 5 is binarized by the signal-processing section 34 provided in the sensor controller l0b, and the value of a change point at the moment when a change occurs from L(or H) to H (or L) is extracted from the binarized data and is held by a latch circuit. This is then stored in the memory 32 as wafer-edge position data. This operation is repeated until the wafer 1 makes one rotation, and outer-circumference positional data corresponding to one rotation of the wafer is stored in the memory 32. Based on this data, the arithmetic section 33 calculates at least one of the center position, orientation flat, and notch position of the wafer 1. Herein, the system controller 17b outputs information that shows either an ordinary mode where the CCD linear sensor 5 is provided such that the scanning direction of the CCD linear sensor 5 is the same as the direction in which the wafer is inserted or an inversion mode where the CCD linear sensor 5 is provided such that the scanning direction of the CCD linear sensor 5 becomes opposite to the direction in which the wafer is inserted, i.e., the system controller 17b outputs a sensor-direction-set signal to the sensor controller 10b.

If the wafer 1 is opaque, the CCD linear sensor 5 is disposed such that scanning is performed from the same direction as the wafer insertion direction in which the effects of dirt adhering to the CCD linear sensor 5 are slight, and the sensor-direction-set signal indicating that the mounting direction of the CCD linear sensor 5 is in the ordinary mode is output from the system controller 17b to the sensor controller 10b. The signal-processing section 34 in the sensor controller 10b that has received the sensor-direction-set signal indicating the ordinary mode reverses the output signal of the CCD linear sensor 5, and binarizes it. The edge position of the wafer 1 is a change point where a change occurs from the L (or H) level of the binarized data to the H (or L) level, and the edge position of the wafer 1 is sensed by counting the transfer clock to this change point.

Figure 8:
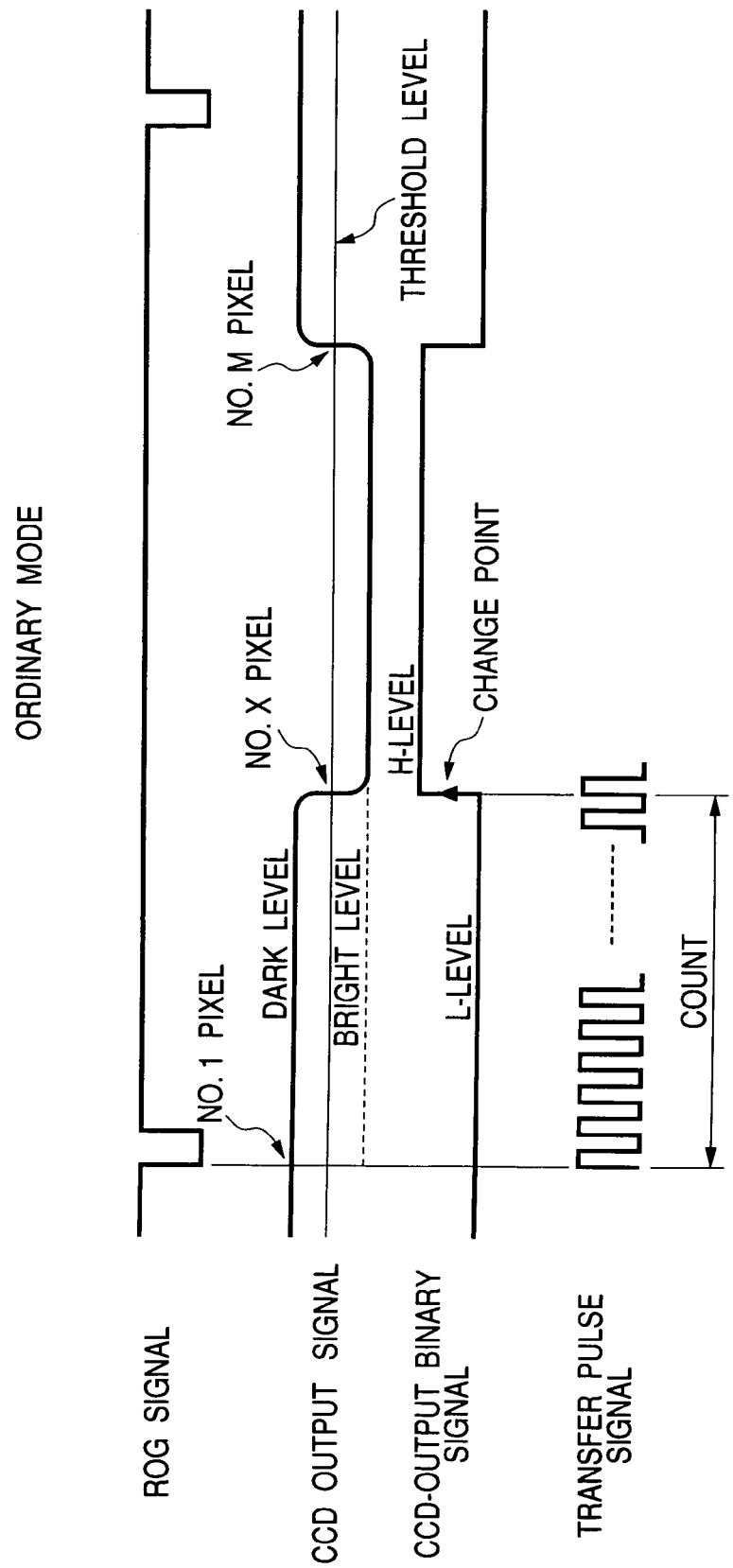
FIG. 8 is a timing chart obtained when the edge position of an opaque wafer is sensed.
Figure 9:
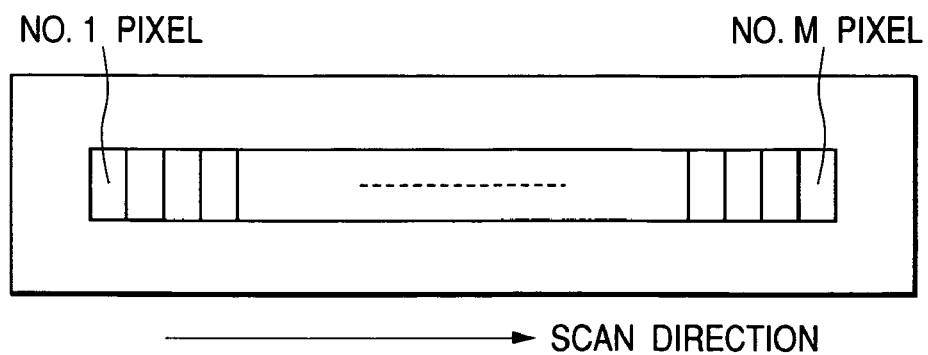
FIG. 9 is a diagram explaining a CCD linear sensor.

The aforementioned operation will hereinafter be described in detail with reference to FIG. 8. In FIG. 8, in order to obtain a CCD-output signal of the CCD linear sensor 5, an ROG signal is output from the signal-processing section 34 to the CCD linear sensor 5, and a transfer pulse signal is input to the CCD linear sensor 5. Thereby, the CCD-output signal of the CCD linear sensor 5 can be obtained. Meanwhile, each pixel of the CCD linear sensor is generally arranged as shown in FIG. 9. The quantity of received light is transformed into an electrical signal by scanning in a fixed direction from No.1 of an end thereof to No. M of an opposite end thereof. In greater detail, a pixel output signal synchronizing with the transfer pulse signal shown in FIG. 8 is a CCD output signal. The CCD output signal has a dark level corresponding to the part where light emitted by the light source 7 is shielded by the wafer and a bright level corresponding to the part where the light is not shielded by the wafer. Therefore, a change occurs from the dark level to the bright level at the pixel of No. X corresponding to the edge part of the wafer. The CCD output signal is binarized by a threshold level predetermined by the signal-processing section 34, and transfer clock pulses to a point where the CCD-output binary signal is changed from L to H are counted. Thus, the wafer edge position of an opaque wafer on the CCD linear sensor 5 can be sensed.

Figure 10:
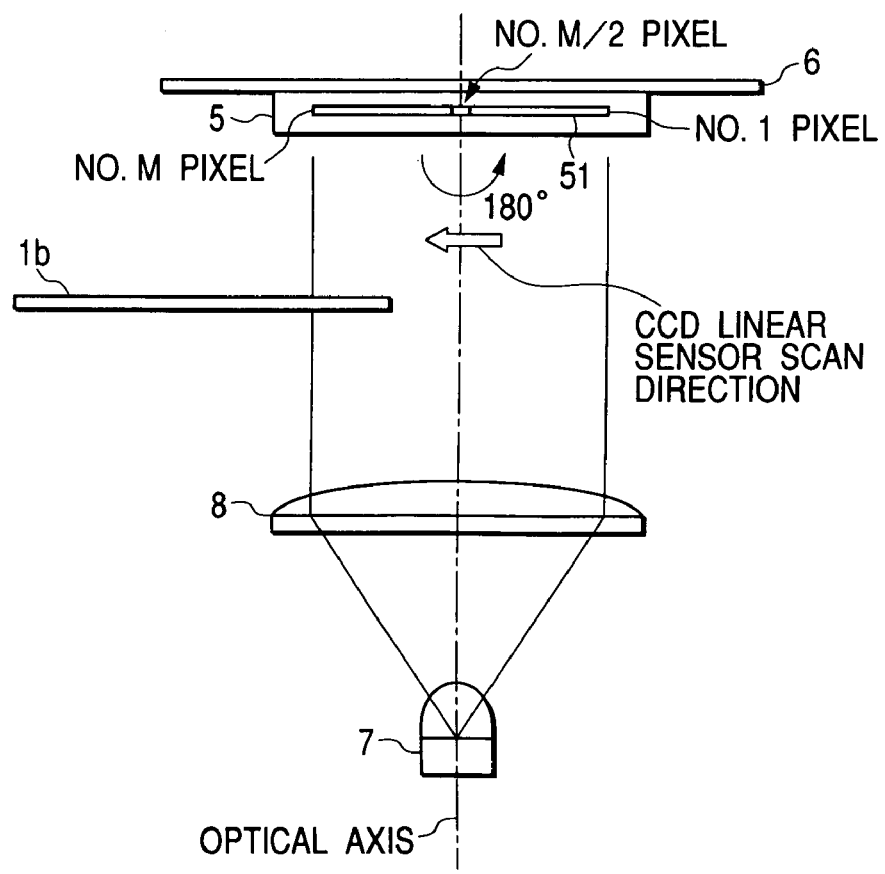
FIG. 10 is a view explaining the sensing of the edge position of a transparent or semitransparent glass wafer.

Next, referring to FIG. 10, a description will be given of a method for sensing a wafer edge position when the wafer 1 is made of a transparent or semitransparent material like a glass wafer. When light emitted by the light source 7 is shielded by the glass wafer, only the edge part thereof blocks the light in a situation where the glass wafer is used. It is impossible to accurately sense the edge of the glass wafer in the ordinary mode. For this reason, the CCD linear sensor 5 has its direction changed, as shown in FIG. 10, so that scanning is performed from a direction opposite to the wafer insertion direction. A sensor-direction-set signal indicating that the mounting direction of the CCD linear sensor 5 is in the inversion mode is then sent from the system controller 17b to the sensor controller 10b. The signal-processing section 34 in the sensor controller 10b that has received the signal reverses the CCD output signal of the CCD linear sensor 5 and binarizes it by a predetermined threshold level. The binarized data is further reversed. Thereafter, the transfer clock to the change point where the signal changes from L to H is counted, and a resulting value is output as the edge position of the glass wafer 1b.

Figure 11:
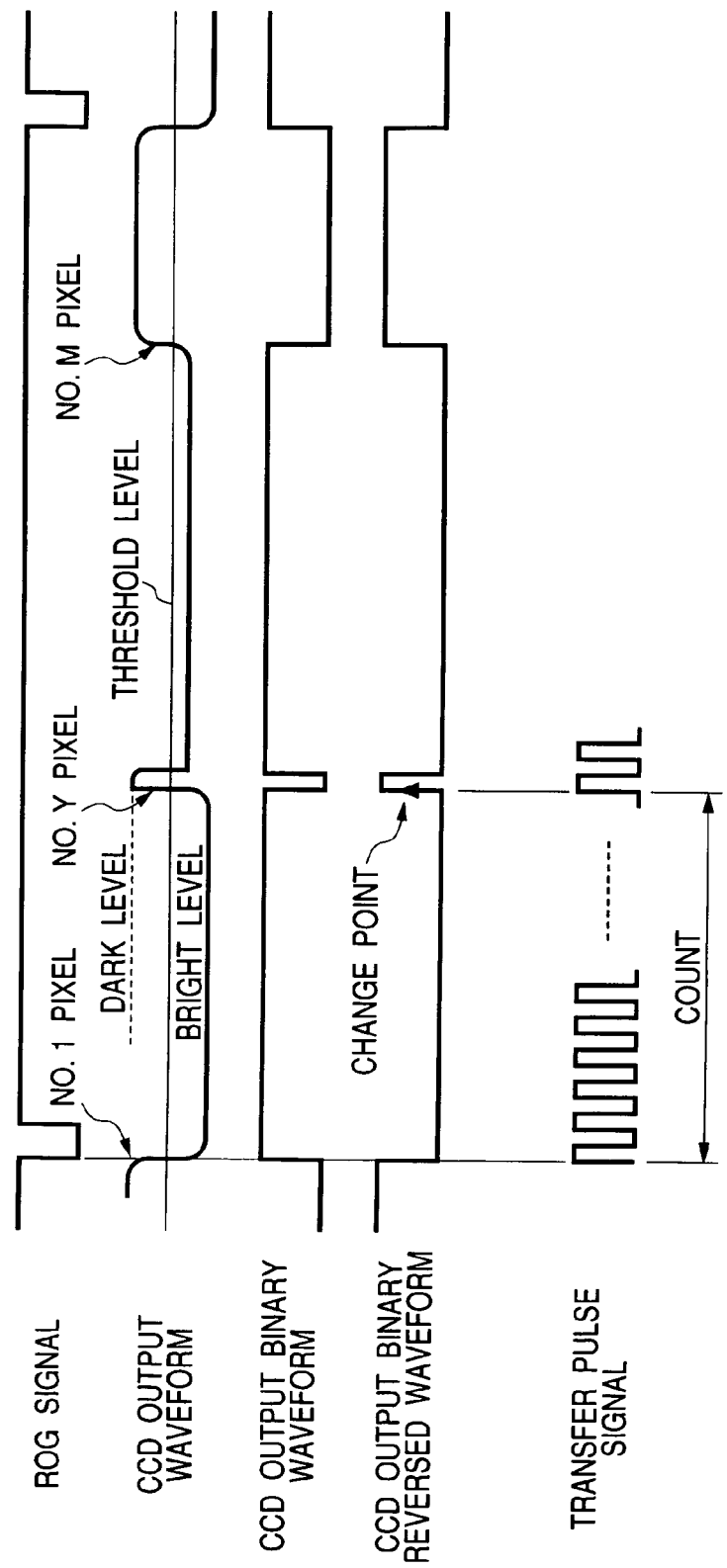
FIG. 11 is a timing chart obtained when the edge position of the transparent or semitransparent glass wafer is sensed.
Figure 12:
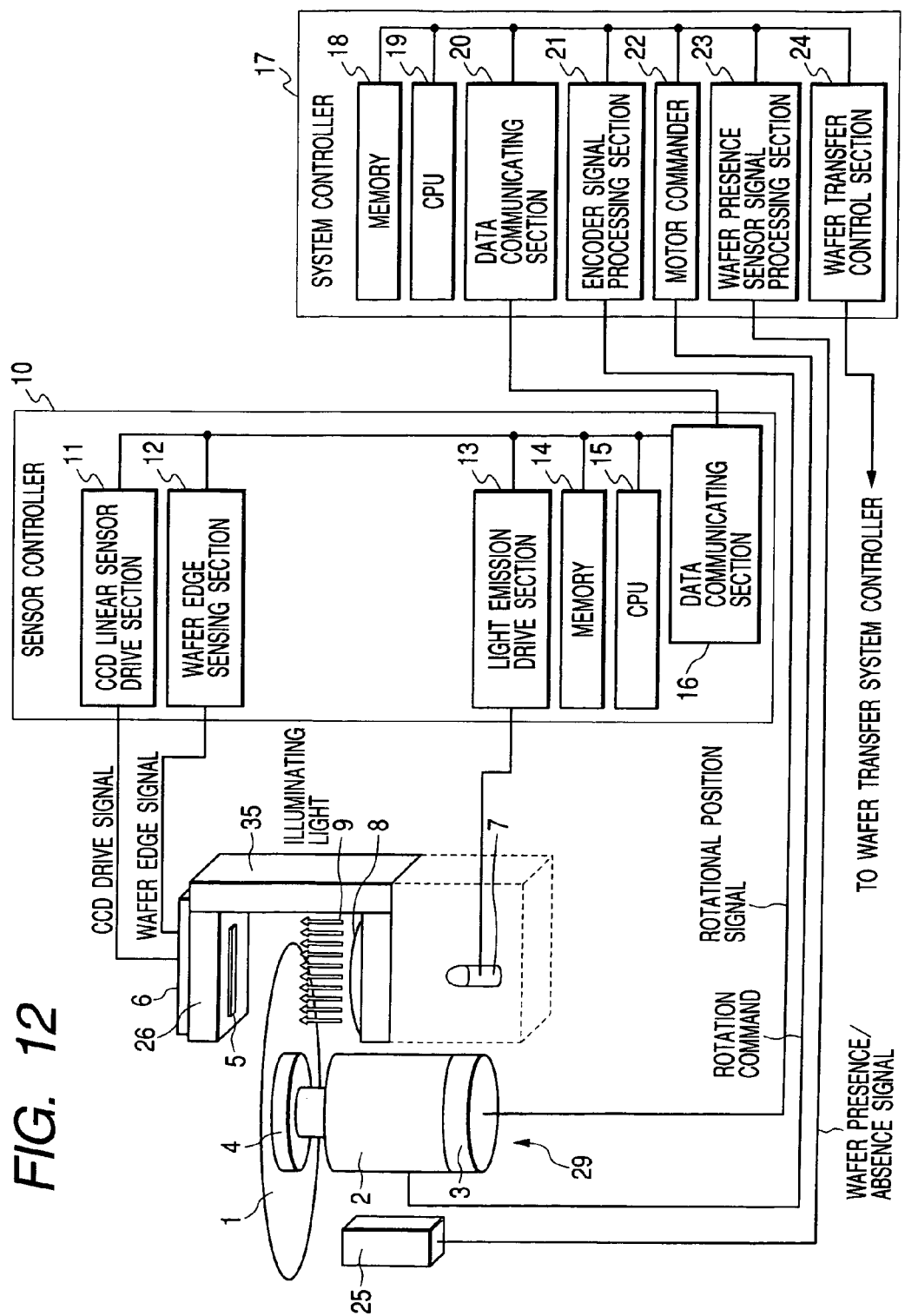
FIG. 12 is a block diagram showing the structure of a conventional wafer prealignment apparatus.
Figure 13:
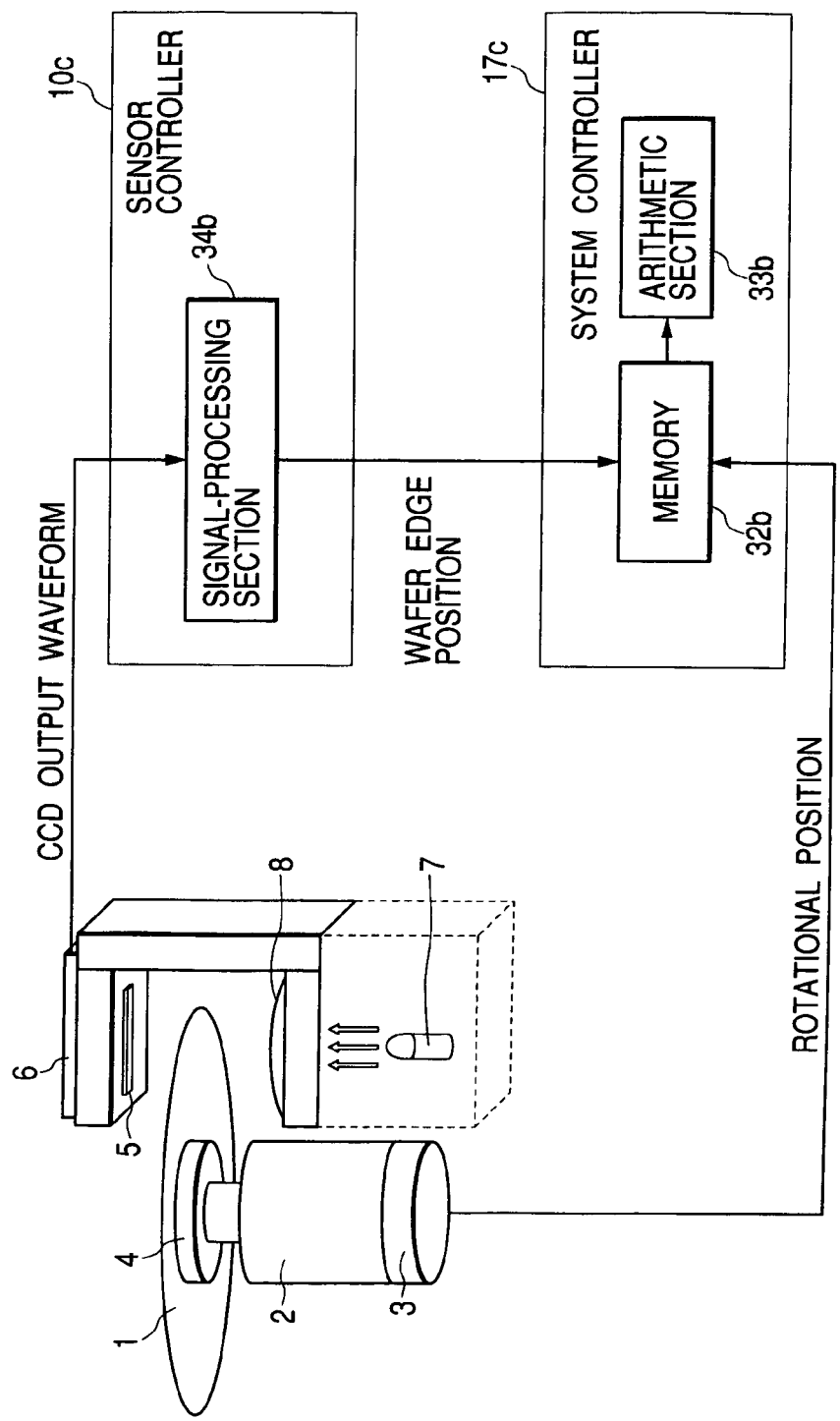
FIG. 13 is a block diagram showing the structure of a wafer prealignment apparatus for executing a conventional wafer-edge-position-sensing method.

Next, the aforementioned operation will be described in detail with reference to FIG. 11. Since light emitted by the light source 7 is shielded in a very small area of the edge part of the glass wafer, the CCD output signal has a dark level within a small range of pixels following the pixel of No. Y corresponding to the edge position of the glass wafer as shown in FIG. 11. When the signal-processing section 34 binarizes this CCD output signal by a predetermined threshold level as in the ordinary mode, the signal is turned into a CCD-output binary signal of FIG. 11. The signal-processing section 34 further reverses the CCD-output binary signal by receiving the sensor-direction-set signal which is the inversion mode, and generates a CCD-output-binary-reversal signal shown in FIG. 11. The edge position on the CCD linear sensor 5 can be sensed by counting the transfer clock pulses to a change point where the CCD-output-binary-reversal signal changes from the L level to the H level as in the ordinary mode.

According to the measuring method of the present invention, the point where the CCD-output binary signal changes from the L level to the H level is regarded as a wafer edge position even if some surface treatment is applied onto the surface of the glass wafer 1*b* so as to change the transmittance of the glass wafer 1*b* and exert an influence on a CCD output waveform. Therefore a correct edge position can be obtained without any trouble.

Next, a description will be given of a method for outputting a signal showing the same position even in the inversion mode, which is the same position as in the ordinary mode, when the CCD linear sensor 5 is set from the ordinary mode to the inversion mode. If the pixels of the CCD linear sensor 5 range from No. 1 to No. M, the CCD linear sensor 5 is disposed such that a No. M/2 pixel that is the M/2-th in order coincides with the optical axis as shown in FIG. 10. By this arrangement, it becomes possible to obtain a signal showing the same position as in the ordinary mode, with the edge position of the glass wafer 11 at the same position, even in the inversion mode in which the CCD linear sensor 5 makes a turnabout of 180 degrees. In greater detail, if X is calculated from Equation X=M−Y when a No. Y pixel position, which is the edge position of the glass wafer 1*b* in the inversion mode, is sensed by the system controller 17*b* as shown in FIG. 11, X corresponds to the edge position in the ordinary mode. Thus, it is possible to obtain a pixel position signal corresponding to the edge position in the ordinary mode.

In the ordinary mode, it is permissible to regard a change point where the CCD-output binary signal changes from H to L as the edge signal of the wafer without reversing the output signal of the CCD linear sensor in binarizing it. Likewise, in the inversion mode, it is permissible to regard a change point where a CCD-output-binary-reversal signal, which is obtained by generating a CCD-output binary signal and further reversing the CCD-output binary signal, changes from H to L as the edge signal of the wafer without reversing the output signal of the CCD linear sensor in binarizing it, in connection with the ordinary mode.

Further, it is permissible to generate the CCD-output binary signal from the output signal of the CCD linear sensor 5 in the CCD linear sensor mounting board 6. As a result, the same function as in the aforementioned structure can be obtained.

Figure 14:
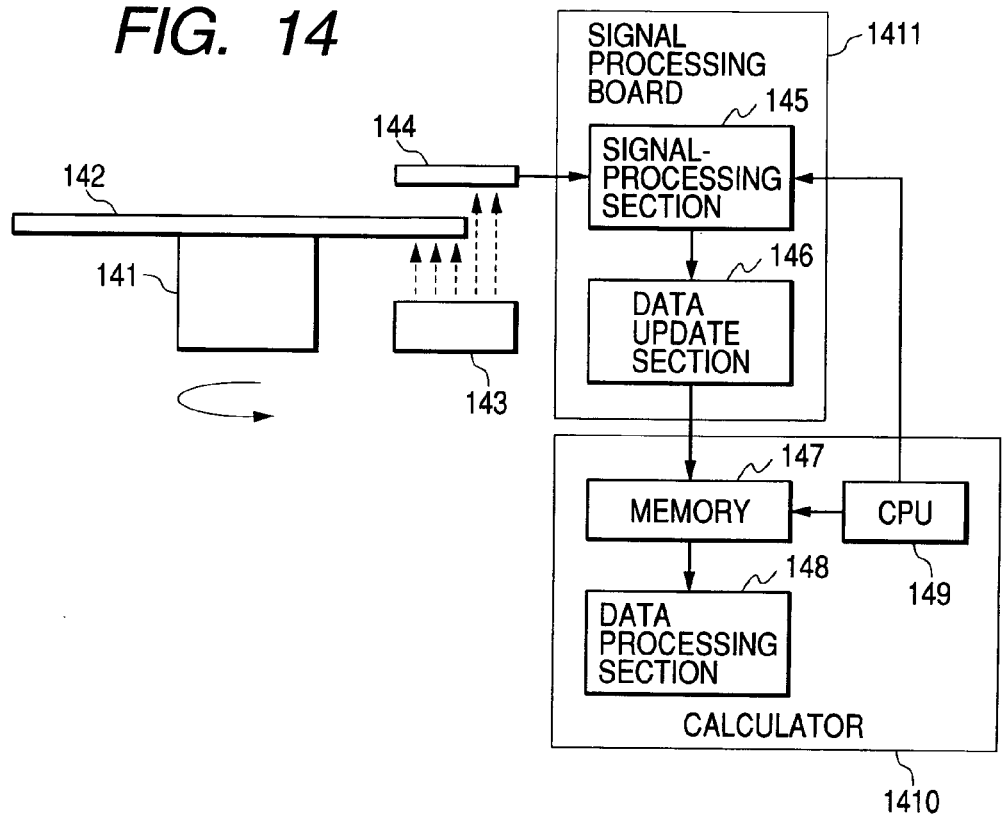
FIG. 14 is a block diagram showing the structure of a prealignment sensor for executing a method of the present invention.
Figure 15:
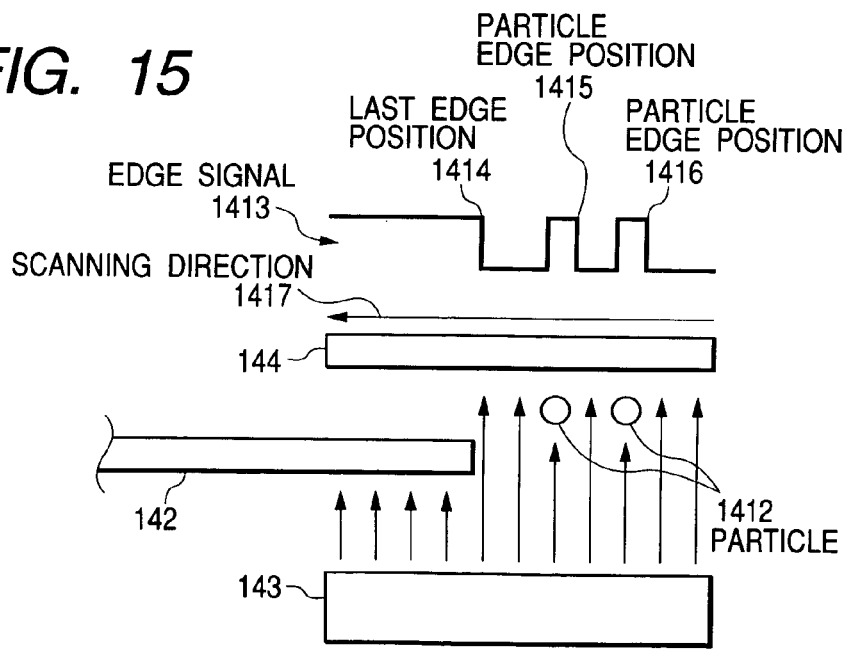
FIG. 15 is a view explaining a sense signal.
Figure 16:
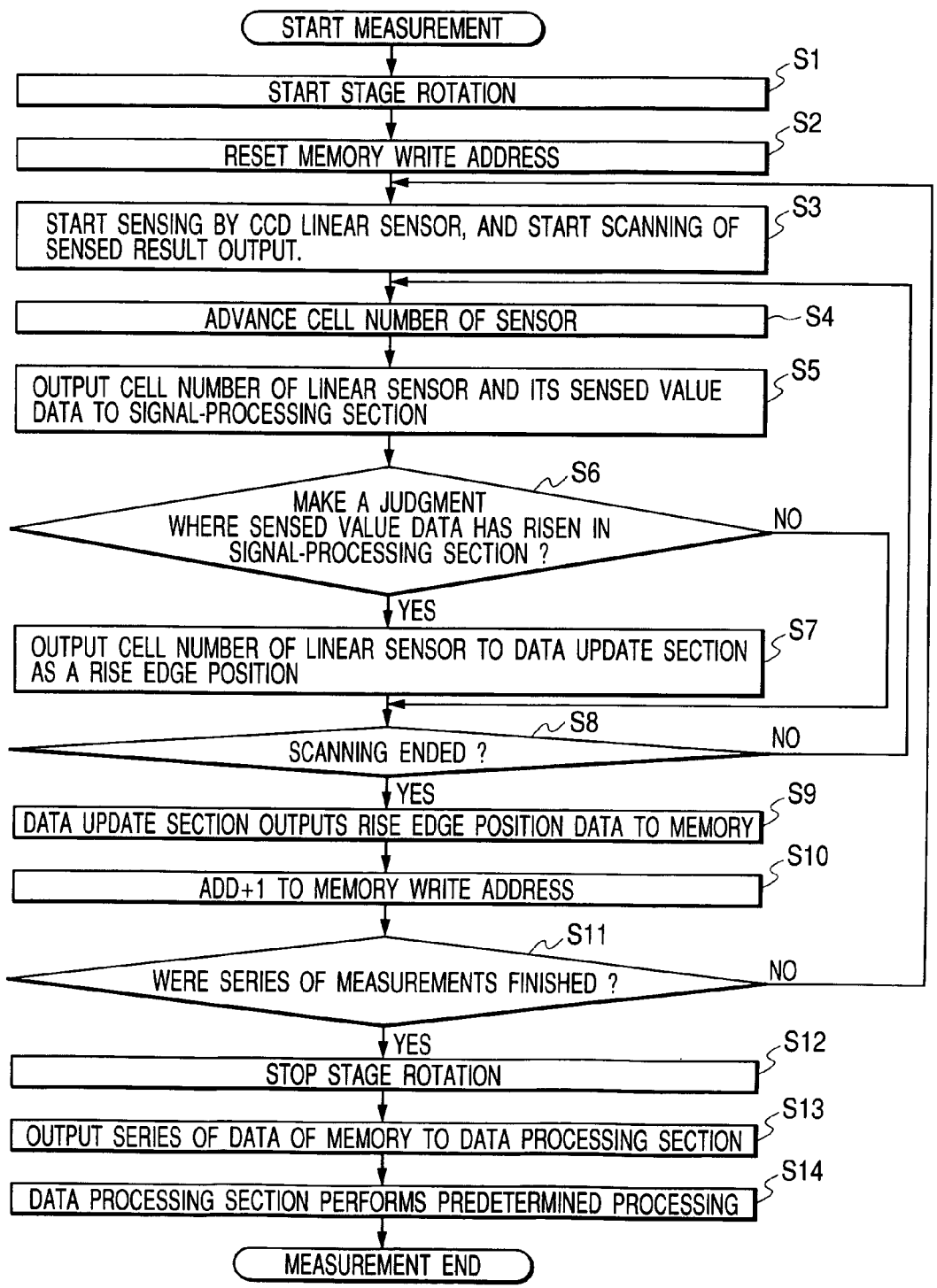
FIG. 16 is a flowchart showing the processing procedure of a method of the present invention.
Figure 17:
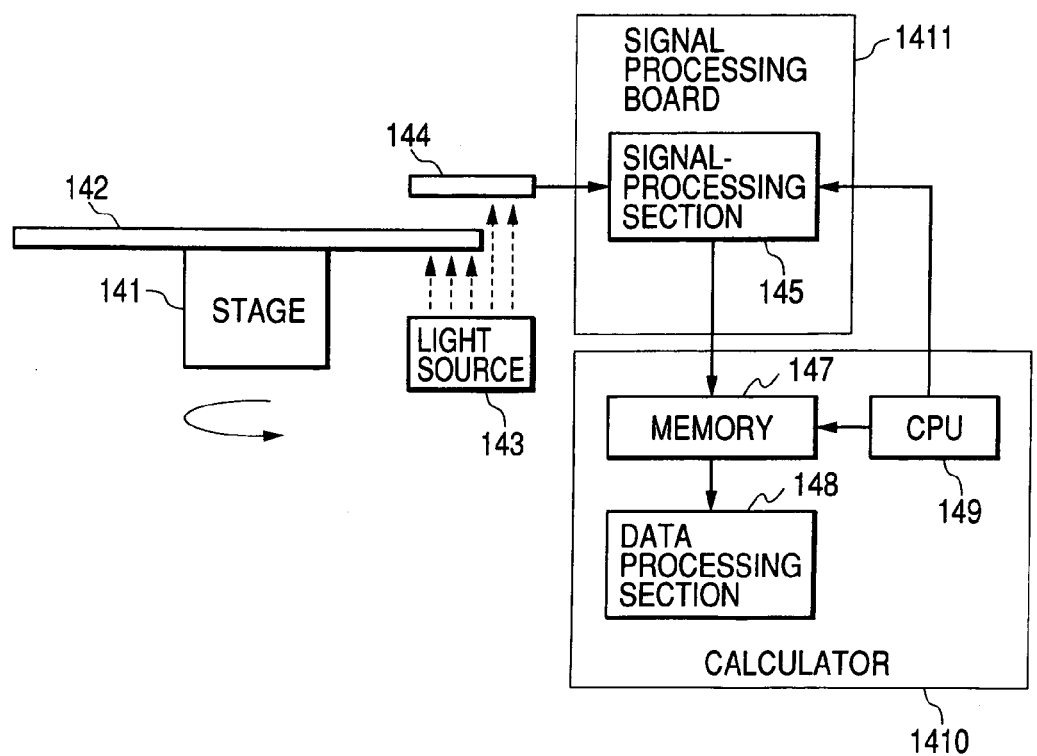
FIG. 17 is a block diagram showing the structure of a conventional prealignment sensor.

Next, a method for sensing the wafer edge position of a wafer of the present invention will be described with reference to the drawings. FIG. 14 is a block diagram showing the structure of the prealignment sensor for executing the method of the present invention, FIG. 15 is a view explaining a sense signal, and FIG. 16 is a flowchart showing the processing procedure of the method of the present invention.

In FIG. 14, a substantially circular opaque wafer 142 is placed on a rotatable stage 141, and a light source 143 and a CCD linear sensor 144 serving as a light-receiving element are disposed at the lower part and the upper part, respectively, with the outer circumference of the wafer 142 therebetween. When the light of the light source 143 is shielded by the wafer 142, a bright and dark image is projected onto the CCD linear sensor 144. This image is binarized as an edge signal of the wafer 142 by a signal-processing section 145 provided on a signal processing board 1411, and the rise position of the binarized edge signal is latched as an edge position.

Herein, referring to FIG. 15, a description will be given of a method for correctly sensing the edge position of the wafer 142 when particles 1412 adhere to the CCD linear sensor 144. In FIG. 15, light emitted by the light source 143 is shielded by particles 1412 and the wafer 142 when the particles 1412 adhere to the CCD linear sensor 144 or when the particles 1412 are floating between the light source 143 and the CCD linear sensor 144. The CCD linear sensor 144 includes an edge signal 1413 in which sensed data having cell numbers in order from right to left and concerning brightness or darkness is output and binarized. In order that the edge positions 1414 and 1415 of the particles of the edge signal 1413 may not be sensed as wafer edge positions by a mistake, the scanning direction 1417 of the CCD linear sensor 144 in the present invention is given from the outer circumference side to the inside of the wafer 142, i.e., from brightness to darkness. Since the wafer 142 is opaque on the wafer inside of the edge position of the wafer 142, the edge signal 1413 does not change, and, accordingly, the last edge position 1414, which is the rise point of the latest edge signal, is sensed as edge position data, and is stored as the edge position of the wafer 142 in the memory 147.

In greater detail, it is judged whether scanning from the right end to the left end of the CCD linear sensor 144 has been finished or not in the data update section 146 of FIG. 14. If finished, the signal latched as an edge position in the signal-processing section 145 is stored as wafer edge position data in the memory 147. This is repeated a predetermined number of times during one rotation of the wafer 142. In the data processing section 148, the orientation flat position or the notch position of the wafer 142 is calculated using the thus obtained wafer edge position data for one round of the wafer 142.

Next, the aforementioned method will be described in greater detail according to the flowchart of FIG. 16. The substantially circular opaque wafer 142 is first placed on the stage 1, for example, by a robot not shown and is fixed, for example, by an adsorption mechanism, not shown, mounted on the stage 141, and the light source 143 projects light onto the edge of the wafer 142. Subsequently, (S1) when the stage 141 begins to rotate while placing the wafer 142 thereon, (S2) the write address of the memory 147 mounted on a calculator 1410 is reset. (S3) The CCD linear sensor 144 receives the light of the light source 143 and simultaneously senses its brightness and darkness and holds an electric charge in its interior. (S4) At this time, the cell number of a light-receiving cell is advanced by one from the right end to the left end of FIG. 1, and (S5) the cell number and the sensed value data concerning brightness or darkness are output to the signal-processing section 145.

(S6) In the signal-processing section 146, it is judged whether the sensed value data has risen or not by comparison with the sensed value data of the cell number previous by one. If it has risen, (S7) the cell number of the linear sensor is output as a rise edge position to the data update section 146, and (S8) it is judged whether the scanning from the right end to the left end of the CCD linear sensor 144 has been finished or not. If it is not judged that it has risen in (S6), processing proceeds to (S8) without performing (S7). If it is not judged that the scanning has been finished in (S8), processing proceeds to (S4), and the procedure from (S4) to (S7) is repeated. If it is judged that the scanning has been finished, (S9) the data update section 146 rises, and the edge position data is output to the memory 147. Subsequently, (S10) the write address of the memory 147 is changed to add +1, and (S11) it is judged whether the series of measurement steps have been ended or not. If the steps have not been ended, processing returns to (S3), and the procedure of from (S3) to (S10) is repeated. If it is judged that the series of measurement steps have been ended, (S12) the rotation of the stage 141 is stopped. (S13) The series of data stored in the memory 147 in this way are output to the data processing section 148, and (S14) predetermined processing imposed on the data processing section 148 is performed, and measurement is completed. Thereafter, based on the orientation flat position or the notch position that has been output, the stage 141 is rotated to a specified position, the wafer 142 is then positioned, the wafer 142 is then released from being fixed, and the wafer 142 is conveyed to the next step.

The present invention is a magnetic disk, such as a floppy disk, an optical disk, such as a CD-ROM, and various computer-readable recording media that describe the procedures for executing the wafer edge position sensing method as a computer program. A computer that reads this can carry out the aforementioned function as a data update section.

Figure 18:
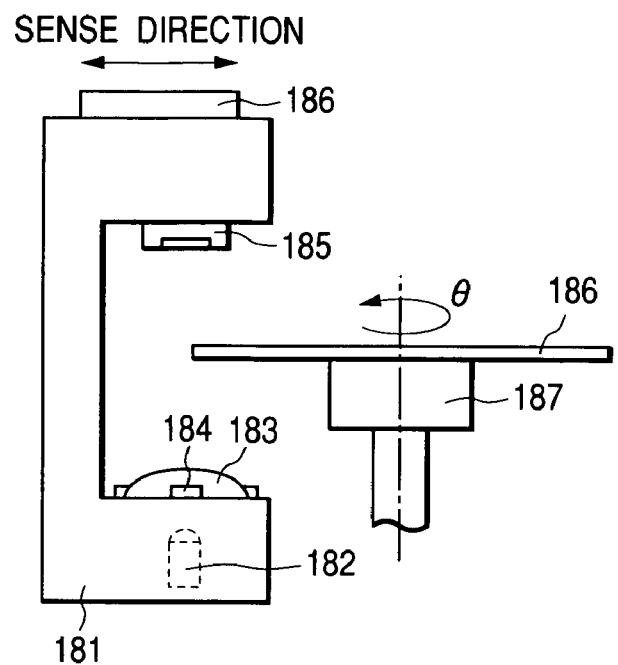
FIG. 18 is a front view of a prealignment sensor of the present invention.
Figure 19:
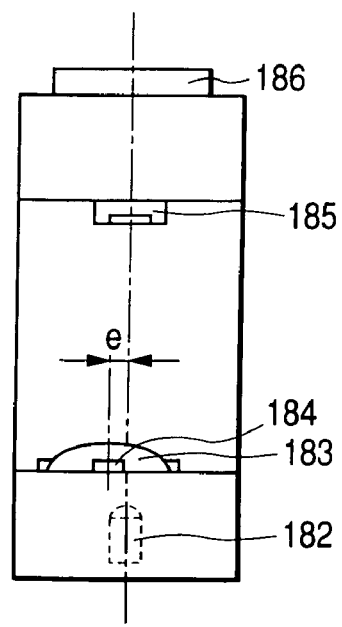
FIG. 19 is a side view of the prealignment sensor of the present invention.
Figure 20:
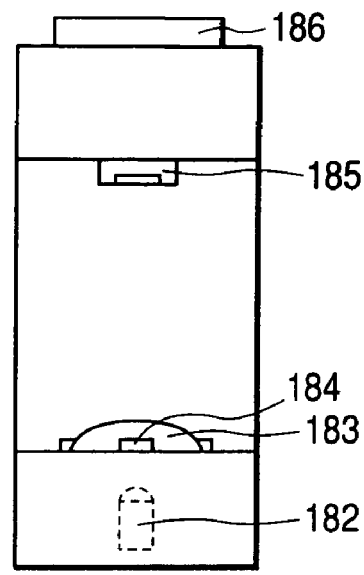
FIG. 20 is a side view of a conventional prealignment sensor.

Next, the prealignment sensor of the present invention will be described with reference to the drawings. FIG. 18 is a side view showing an embodiment of the present invention. FIG. 19 is front view, and is different from the front view of FIG. 20 describing a conventional technique only in that the position of the convex lens 184 changes. Since reference numerals are uniform from FIG. 18 to FIG. 20, repeated description of the structure is omitted.

The material used for the frame 181 is aluminum subjected to sulfuric-acid hard alumite treatment and then to steam sealing. The aluminum of sulfuric-acid hard alumite is characterized by having a hard oxide-film surface and having excellent corrosion resistance in comparison with aluminum subjected to usual alumite treatment. However, on the other hand, fine holes are formed in its treated surface by alumite treatment. This causes the emission of gas in a vacuum, and causes deterioration in corrosion resistance in a chemical atmosphere. Therefore, the fine holes formed by alumite treatment are shielded up by steam sealing. A feature of aluminum subjected to the aforementioned surface treatment resides in being slight in the emission of gas and being excellent in corrosion resistance.

The material used for the lens holder 184 is fluororesin. Likewise, fluororesin is slight in the emission of gas and is excellent in corrosion resistance. Therefore, it is possible to achieve excellent low-gas emission properties and excellent corrosion resistance.

The signal processing circuit 186 has electronic parts mounted on a printed board, and is molded with an epoxy resin. However, even if the signal processing circuit has electronic parts mounted on a printed board, it has a problem of emitting much gas and having inferior corrosion resistance. Therefore, the surface is covered with an epoxy resin for protection, thereby restricting gas emission and improving corrosion resistance. If an alumina-filled epoxy resin is used as the epoxy resin to be molded, the alumina-filled epoxy resin is less deformed when hardened than resins usually used because the alumina-filled epoxy resin has alumina. Therefore, the stress to the electronic parts is weakened, and the electronic parts are not peeled off, thus enhancing reliability.

Figure 21:
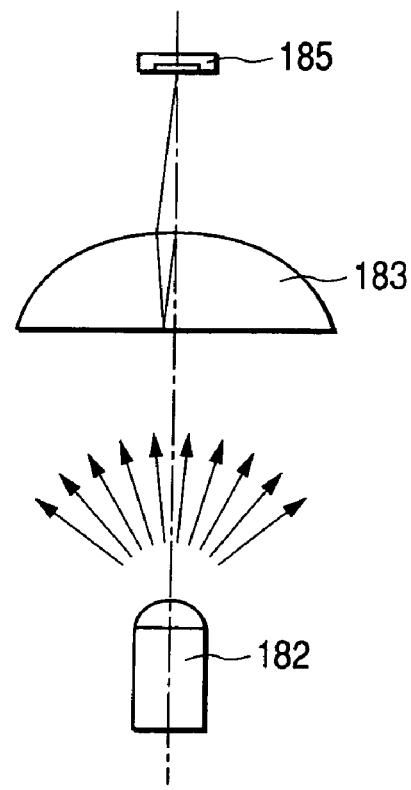
FIG. 21 is a view explaining an advantageous effect of the prealignment sensor of the present invention.

Next, FIG. 19 and FIG. 21 will be described. In the Figures, the center position of the convex lens 183 is characterized by being offset in a direction perpendicular to the sensing direction from a center line connecting the center of the light source 182 and the center of the optical receiver 185, i.e., in right and left directions of FIG. 19. FIG. 19 and FIG. 21 each show a case where it is displaced by "e" leftward. By disposing it in this manner, although part of the diffused light emitted from the light source 182 reflects in the interior of the convex lens 183, the light never concentrates at the center of the optical receiver 185, and the luminous intensity level of parallel light exiting from the convex lens 183 is uniformed in the sensing range. Therefore, the received-light level in the optical receiver 185 never becomes uneven. Since the optical brightness and darkness can be infallibly sensed by the optical receiver 185, greater sensing accuracy can be obtained.

In the above embodiments, the light source 182 and the lens 183 are disposed at the lower part of the frame 181, and the optical receiver 185 is disposed at the upper part thereof as shown in FIG. 18 to FIG. 21. However, the light source 182 and the lens 183 may be disposed at the upper part of the frame 181, and the optical receiver 185 may be disposed at the lower part thereof, whereby the same effect is achieved.

INDUSTRIAL APPLICABILITY

As described above, according to the present invention, the wafer prealignment apparatus has a wafer presence/absence sensing function formed of the light emission drive section, the wafer edge sensing section, the photodiode, the luminous energy signal processing section, the comparison judgment means, and the output means, and it is determined that the wafer is absent if the wafer edge sensing section cannot sense a wafer edge, and the luminous energy value of the photodiode is equal to a value obtained when light is admitted thereto, it is determined that the wafer is present if the wafer edge sensing section cannot sense a wafer edge, and the luminous energy value of the photodiode is equal to a value obtained when light is shielded, it is determined that the wafer is present if the wafer edge sensing section senses a wafer edge, and the luminous energy value of the photodiode is equal to a value obtained when light is shielded, and it is determined that unnecessary objects adhere to the CCD linear sensor if the wafer edge sensing section senses a wafer edge, and the luminous energy value of the photodiode is equal to a value obtained when light is admitted thereto, and judgment results are output to the system controller. Therefore, advantageously, the presence or absence of the wafer can be sensed without providing the wafer presence sensor besides the prealignment apparatus, and the apparatus can be reduced in size and in cost.

Further, according to the present invention, the time measuring means is provided which comprises the timer for measuring time between the measurement command and the ROG signal and the timer for measuring time between measurement commands corresponding to measurement positions, and an angular error between a proper measurement position and a position where the electric charge of the CCD linear sensor has been read is corrected by using time obtained by the timer that measures time between the measurement command and the ROG signal of the CCD linear sensor corresponding to the plurality of predetermined measurement positions over the outer circumference of the wafer and time obtained by the timer that measures time between measurement commands corresponding to the plurality of predetermined measurement positions over the outer circumference of the wafer. Therefore, advantageously, signal processing can be simplified so that prealignment time can be shortened, and the wafer prealignment apparatus having the prealignment sensor of high precision can be provided.

Further, according to the present invention, the CCD linear sensor is disposed at a position where it can make a turnabout of 180 degrees, and, when the CCD line sensor makes a turnabout of 180 degrees, the binary output signal of the CCD linear sensor is reversed, and the same signal is output at the same position prior to the turnabout. Therefore, advantageously, a wafer can be handled in spite of the fact that the wafer is made of either an opaque material or a transparent material, and the edge position of the wafer can be sensed with high general-purpose properties.

Further, according to the present invention, even if a binarized wafer edge signal changes at a plurality of positions because particles have adhered to the CCD linear sensor, a latest change point can be sensed as a wafer edge position. Therefore, advantageously, the edge position of the wafer can be sensed correctly.

Further, according to the prealignment sensor of the present invention, the sensor can stably operate in a vacuum, in a chemical atmosphere, or in a similar environment, and therefore a great effect can be achieved by which more highly accurate displacement sensing can also be performed.

What is claimed is:

1. A prealignment sensor comprising:
   a frame fixed to a base and having a U-shape when viewed from its side;
   a light source attached to a lower part of the frame;
   a convex lens attached to a lower part of an inside of the frame by which diffused light of the light source is transformed into parallel light;
   a lens holder for fixing the convex lens to the frame;
   an optical receiver attached to an upper part of an inside of the frame by which the parallel light is received and is transformed into an electrical signal; and
   a signal processing circuit attached to the frame by which the electric signal is transformed into a desired displacement magnitude;
   wherein the frame is formed of aluminum subjected to sulfuric-acid hard alumite treatment and then to steam sealing,
   wherein the convex lens is disposed such that a center position thereof is slightly offset from a center of an optical axis connecting a center of the light source and a center of the optical receiver in a horizontal direction perpendicular to a sensed direction.

2. A prealignment sensor as set forth in claim 1, wherein the lens holder is made of fluororesin.

3. A prealignment sensor as set forth in claim 1, wherein the signal processing circuit is covered with epoxy resin.

4. A prealignment sensor as set forth in claim 3, wherein the epoxy resin is alumina-filled epoxy resin.

5. A prealignment sensor comprising:
   a frame fixed to a base and having a U-shape when viewed from its side;
   a light source attached to an upper part of the frame;
   a convex lens attached to an upper part of an inside of the frame by which diffused light of the light source is transformed into parallel light;
   a lens holder for fixing the convex lens to the frame;
   an optical receiver attached to a lower part of an inside of the frame by which the parallel light is received and is transformed into an electrical signal; and
   a signal processing circuit attached to the frame by which the electric signal is transformed into a desired displacement magnitude;
   wherein the frame is formed of aluminum subjected to sulfuric-acid hard alumite treatment and then to steam sealing,
   wherein the convex lens is disposed such that a center position thereof is slightly offset from a center of an optical axis connecting a center of the light source and a center of the optical receiver in a horizontal direction perpendicular to a sensed direction.

6. A prealignment sensor as set forth in claim 5, wherein the lens holder is made of fluororesin.

7. A prealignment sensor as set forth in claim 5, wherein the signal processing circuit is covered with epoxy resin.

8. A prealignment sensor as set forth in claim 7, wherein the epoxy resin is alumina-filled epoxy resin.

* * * * *